US007528746B2

(12) United States Patent
Adachi

(10) Patent No.: US 7,528,746 B2
(45) Date of Patent: May 5, 2009

(54) ENCODING DATA GENERATION METHOD AND DEVICE

(75) Inventor: Shinya Adachi, Kanagawa (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/835,066

(22) Filed: Aug. 7, 2007

(65) Prior Publication Data
US 2007/0273570 A1  Nov. 29, 2007

Related U.S. Application Data

(63) Continuation of application No. 10/556,178, filed on Nov. 9, 2005, now Pat. No. 7,271,746.

(30) Foreign Application Priority Data

Oct. 17, 2003 (JP) .............................. 2003-357730

(51) Int. Cl.
H03M 7/30 (2006.01)
(52) U.S. Cl. .......................................... 341/76; 341/50
(58) Field of Classification Search .................... 341/50, 341/59, 76, 150; 701/1, 29, 35
See application file for complete search history.

(56) References Cited

U.S. PATENT DOCUMENTS

| 4,216,446 | A | 8/1980 | Iwer |
| 5,012,238 | A | 4/1991 | Hayashi |
| 5,278,759 | A | 1/1994 | Berra |
| 5,491,418 | A | 2/1996 | Alfaro |
| 5,787,366 | A | 7/1998 | Adams |
| 6,477,461 | B2* | 11/2002 | Tanaka et al. ................ 701/209 |

(Continued)

FOREIGN PATENT DOCUMENTS

EP    1 347 427 A2    9/2003

(Continued)

OTHER PUBLICATIONS

Ohnuki T. et al. "A Study on a Selecting Method of Predictive Function in DPCM Coding Scheme." In: 1999 Nen The Institute of Electronics, Information and Communication Engineers Sogo Taikai Koen Ronbunshu, Mar. 8, 1999, Joho System 2, p. 22.

(Continued)

*Primary Examiner*—Brian Young
(74) *Attorney, Agent, or Firm*—Pearne & Gordon LLP

(57) ABSTRACT

In a coded data generation method of resampling a road shape for setting a plurality of nodes, arranging position information of each node represented by a deflection angle from the immediately preceding node to generate a data string of the deflection angles, converting the deflection angles into predicted difference values each indicating the difference from the predicted value, and variable-length coding the data string of the predicted difference values, the data string of the predicted difference values when the deflection angles are converted into the predicted difference values is evaluated and a prediction expression to calculate the predicted value is selected adaptively from among a plurality of prediction expressions φ=1, φ=2, φ=3, and φ=4 based on the evaluation result. The prediction expression to calculate the predicted value is selected adaptively in response to road shape A, B, C, D, so that the data compression effectiveness is enhanced.

10 Claims, 23 Drawing Sheets

U.S. PATENT DOCUMENTS

| | | | |
|---|---|---|---|
| 6,552,670 B2 * | 4/2003 | Sundaravel et al. | 341/5 |
| 6,611,755 B1 * | 8/2003 | Coffee et al. | 701/213 |
| 6,703,947 B1 * | 3/2004 | Wallner | 341/50 |
| 6,768,818 B2 * | 7/2004 | Friederich et al. | 382/233 |
| 6,813,508 B1 * | 11/2004 | Shioda et al. | 455/525 |
| 6,898,490 B2 * | 5/2005 | Yashiki et al. | 701/1 |
| 7,010,398 B2 * | 3/2006 | Wilkins et al. | 701/3 |

FOREIGN PATENT DOCUMENTS

| | | |
|---|---|---|
| JP | 9-200774 | 7/1997 |
| JP | 10-56388 | 2/1998 |
| JP | 2003-023357 | 1/2003 |
| JP | 2003-203243 | 7/2003 |

OTHER PUBLICATIONS

International Search Report for International Application No. PCT/JP2004/015274, by Japanese Patent Office, completed on Dec. 14, 2004.

* cited by examiner

FIG. 2(a) ROAD SHAPE DATA A

| [DATA NUMBER] | --- ANGLE (DEG), ZONE LENGTH CODE --- |
|---|---|
| [ 1 ~ 10] | <5> 0 <3> 0 -2 6 3 1 2 2 |
| [11 ~ 20] | 2 2 <5> <4> <3> 2 3 2 1 -1 |
| [21 ~ 30] | 3 <5> 0 1 1 <3> 0 -1 -3 -5 |
| [31 ~ 40] | -1 1 -1 1 2 1 1 -5 <5> <5> |
| [41 ~ 50] | -1 <3> 3 2 3 4 1 2 <5> 1 |
| [51 ~ 60] | -1 -1 <3> 3 0 -1 -1 1 -1 -1 |
| [61 ~ 70] | -7 <2> -1 -1 -1 1 -1 -1 -1 -7 |
| [71 ~ 80] | -1 | | | | | | | | |

FIG. 2(b) ROAD SHAPE DATA B

| [DATA NUMBER] | --- ANGLE (DEG), ZONE LENGTH CODE --- |
|---|---|
| [ 1 ~ 10] | <3> 0 0 <2> -2 -3 -3 -1 -5 -1 |
| [11 ~ 20] | -4 -2 -4 -1 3 -3 1 -3 <4> 0 |
| [21 ~ 30] | 0 2 <3> 3 1 -1 3 2 3 <4> |
| [31 ~ 40] | 0 2 -1 1 0 3 0 1 0 0 |
| [41 ~ 50] | 0 0 <3> 0 <3> 0 4 <5> <5> 2 |
| [51 ~ 60] | <3> 5 -2 0 0 -1 1 2 0 0 |
| [61 ~ 70] | -2 -2 -3 | | | | | | | -12 |

FIG. 2(c) ROAD SHAPE DATA C

| [DATA NUMBER] | --- ANGLE (DEG), ZONE LENGTH CODE --- |
|---|---|
| [ 1 ~ 10] | <2> 0 -11 -20 -7 -7 -9 -27 14 <1> |
| [11 ~ 20] | 16 0 0 2 17 10 3 10 5 0 |
| [21 ~ 30] | <3> -5 <2> -2 0 0 7 4 0 -1 |
| [31 ~ 40] | -16 -9 -14 -23 -20 9 35 9 16 -5 <3> |
| [41 ~ 50] | -2 -6 -48 -9 18 0 7 0 30 0 |
| [51 ~ 60] | 7 <2> -6 -1 0 9 13 -2 -2 4 |
| [61 ~ 70] | -7 0 <5> 0 <3> 3 -2 <1> -8 |
| [71 ~ 80] | 4 8 -2 6 <2> 12 4 -7 -5 0 |
| [81 ~ 90] | -18 4 -3 -6 -6 -4 0 0 2 |
| [91 ~ 100] | 0 0 0 13 4 0 -2 -25 -18 4 |
| [101 ~ 110] | 4 19 <1> 22 6 3 23 31 10 -27 |
| [111 ~ 120] | <2> 1 0 1 -13 -13 1 <1> 0 8 |
| [121 ~ 130] | 0 -54 -10 -4 7 18 6 <5> 0 -3 |
| [131 ~ 140] | <2> -3 <3> 0 6 0 <2> 0 <1> 0 |
| [141 ~ 150] | -1 17 0 0 5 0 5 0 -10 -3 |
| [151 ~ 160] | 6 3 -2 11 0 17 20 3 -20 0 |
| [161 ~ 170] | 0 -5 0 0 0 0 -6 25 13 1 -2 |
| [171 ~ 180] | 0 1 0 -18 -2 -5 0 1 -2 6 |
| [181 ~ 190] | 0 0 -5 0 -11 0 -7 <3> 0 -3 -2 |
| [191 ~ 200] | <1> 0 -1 0 0 -1 -1 0 -1 0 |
| [201 ~ 210] | <3> 8 0 0 -2 0 0 0 -6 <2> |
| [211 ~ 220] | 7 0 0 <5> -2 -1 0 0 0 10 -3 |
| [221 ~ 230] | -2 1 0 <5> 0 1 <4> 0 -5 -3 |
| [231 ~ 240] | 0 -3 -4 0 0 3 7 |
| [241 ~ 250] | | | | | | | | | |

NUMERAL IN < > IS RESAMPLE LENGTH CHANGE CODE

FIG. 7

EXAMPLE OF HUFFMAN TABLE

| NUMERIC VALUE (ANGLE) | OCCURRENCE FREQUENCY | CODE | ADDITIONAL CODE (POSITIVE, NEGATIVE SIGN, ETC.) | TOTAL NUMBER OF BITS |
|---|---|---|---|---|
| 0° | 655 | 00 | NONE | 2 |
| 1° | 507 | 110 | 1 BIT (POSITIVE, NEGATIVE SIGN) | 4 |
| 2° | 233 | 1010 | 1 BIT (POSITIVE, NEGATIVE SIGN) | 5 |
| ⁓ | | | | |
| 30° | 4 | 1110000110 | 1 BIT (POSITIVE, NEGATIVE SIGN) | 11 |
| ⁓ | | | | |

RESAMPLING OF LOCUS DATA AT EQUAL DISTANCE L

REPRESENTING OF ANGLE COMPONENT BY DEFLECTION ANGLE

REPRESENTING OF DEFLECTION ANGLE BY PREDICTED DIFFERENCE VALUE

FIG. 27

EXAMPLE OF CODE TABLE

| SPECIAL CODE | CODE | ADDITIONAL BIT | |
|---|---|---|---|
| EOD CODE | 1100 | 0 | |
| INPUT VALUE | | | VALUE RANGE OF $\Delta\theta$ (°) |
| RUN LENGTHS | VALUES OF $\Delta\theta$ (°) | CODE | ADDITIONAL BIT |
| 0 | 0 | 0 | 0 | -1~+1 |
| 5 | 0 | 100 | 0 | " |
| 10 | 0 | 1101 | 0 | " |
| 0 | ±3 | 1110 | 1 (± DISCRIMINATION) | ±2~4 |
| 0 | ±6 | 111100 | 1 (± DISCRIMINATION) | ±5~7 |
| 0 | ±9 | 111101 | 1 (± DISCRIMINATION) | ±8~10 |

ENCODING DATA GENERATION METHOD AND DEVICE

This application is a continuation of application Ser. No. 10/556,178, filed on Nov. 9, 2005.

TECHNICAL FIELD

This invention relates to a generation method of coded data representing a road position, etc., on a digital map and an apparatus for generating and decoding the coded data and is intended for reducing the data amount of the coded data.

BACKGROUND ART

Hitherto, VICS (Vehicle Information Communication System) has conducted the service for providing vehicle information indicating a congestion zone and the travel time through FM multiplex broadcasting and beacon for a vehicle navigation system installing a digital map database. The vehicle navigation system receives the vehicle information and displays a colored congestion zone on a map displayed on a screen and calculates the required time to the destination for display.

Thus, to provide the vehicle information, it becomes necessary to pass position information of a road on a digital map. It is also necessary to report the recommended route and the run locus on a digital map to the associated party in the service for receiving the information on the current location and the destination and providing information on the recommended route through which the destination will be reached in the shortest time and a vehicle information collection system (probe information collection system) for collecting locus information, speed information, etc., from a running vehicle (probe car) advanced in study in recent years.

Hitherto, to report the road position on the digital map, generally the link numbers assigned to roads and the node numbers determining nodes such as intersections have been used. However, the node numbers and the link numbers defined in a road network need to be replaced with new numbers with new construction or change of a road and the digital map data produced by each company must also be updated accordingly and thus the system using the node numbers and the link numbers involves an enormous social cost for maintenance.

To improve such a point, JP-A-2003-23357 a method of reporting the road position on the digital map without using the node numbers or the link numbers and in a small data amount.

In this method, sampling points are again set at given intervals in the road zone on the digital map to be reported (called "equal-distance resample") and compression coding processing is performed for the data string with the position data of the sampling points arranged in order, and the compressed and coded data is transmitted. At the reception party receiving the data, the data string of the position data of the sampling points is reconstructed and the road shape is reproduced on the digital map of the reception party. Using the position data, position determination and position reference are carried out (map matching) on the digital map of the reception party for determining the road zone, as required.

The compression coding for the data string of the position data is performed in the order of (1) conversion of position data to a single variable, (2) conversion of the value represented by the single variable to a value having a statistical bias, and (3) variable-length coding of the provided value as described later:

(1) Conversion of Position Data to a Single Variable

FIG. 26($a$) represents sampling points in a road zone set in equal-distance resample as PJ−1 and PJ. This sampling point (PJ) is uniquely determined by two dimensions of distance (resample length) L from the adjacent sampling point (PJ−1) and angle $\Theta$. Assuming that the distance is constant (L), the sampling point (PJ) can be represented by the single variable of only the angle component $\Theta$ from the adjacent sampling point (PJ−1). In FIG. 26($a$), as the angle $\Theta$, the angle $\Theta$ based on "absolute azimuth" with the due north azimuth (upper part of the drawing) as 0 degrees and the magnitude specified clockwise in the range of 0 to 360 degrees is shown (absolute azimuth from the due north). When xy coordinates (latitude, longitude) of PJ−1 and PJ are (xj−1, yj−1) and (xj, yj), the angle $\Theta$ can be calculated according to the following expression:

$$\Theta j-1 = \tan^{-1}\{(xj-xj-1)/(yj-yj-1)\}$$

Therefore, the road zone can be represented by the data string of the angle components of the sampling points by indicating the constant distance L between the sampling points and the latitude and longitude of the sampling point as the start or the termination (reference point) separately.

(2) Conversion of a Single Variable Value to a Value Having a Statistical Bias

As shown in FIG. 26($b$), the angle component of each sampling point is represented by the displacement difference from the angle component of the adjacent sampling point, namely, "deflection angle" $\theta j$ so that the single variable values of the sampling point become statistically biased values suited for variable-length coding. The deflection angle $\theta j$ is calculated as $$\theta j = \Theta j - \Theta j-1$$

If the road is linear, the deflection angles $\theta$ of the sampling points concentrate on the vicinity of 0 and become data having a statistical bias.

The angle component of the sampling point can be converted into data having a statistical bias by representing the deflection angle $\theta j$ of an attention sampling point PJ by difference value (predicted difference value or predicted error) $\Delta\theta j$ from predicted value Sj of the sampling point PJ predicted using deflection angles $\theta j-1$, $\theta j-2$, ... of the preceding sampling points PJ−1, PJ−2, ... as shown in FIG. 26($c$). The predicted value Sj, for example, can be defined as $$Sj = \theta j-1$$

or can be defined as $$Sj = (\theta j-1 + \theta j-2)/2$$

The predicted difference value $\Delta\theta j$ is calculated as $$\Delta\theta j = \theta j - Sj$$

If the road is curved at a constant curvature, the predicted difference values $\Delta\theta$ of the sampling points concentrate on the vicinity of 0 and become data having a statistical bias.

FIG. 26($d$) is a graph to show the data occurrence frequency when a linear road zone is displayed as the deflection angle $\theta$ and a curvilinear road zone is displayed as the predicted difference value $\Delta\theta$. The maximum appears at $\theta$ (or $\Delta\theta$)=0° and the occurrence frequency of $\theta$ and $\Delta\theta$ has a statistical bias.

(3) Variable-Length Coding

Next, the data string values converted into values having a statistical bias are variable-length coded. Various types of variable-length coding method such as a fixed numeric value compression method (0 compression, etc.,), a Shannon-Fano code method, a Huffman code method, an arithmetic code method, and a dictionary method exist; any method may be used.

Here, the case where the most general Huffman code method is used will be discussed.

In this variable-length coding, highly frequently occurring data is coded with a small number of bits and less frequently occurring data is coded with a large number of bits for reducing the total data amount. The relationship between the data and code is defined based on a code table.

Now, assume that a list of $\Delta\theta$ at the sampling points of a road zone represented in 1° units is

"0_0_−2_0_0_+1_0_0_−1_0_+5_0_0_0_+1_0"

The case where a code table shown in FIG. 27 combining variable-length coding and run-length coding is used to code the data string will be discussed. The code table defines as follows: Minimum angle resolution ($\delta$) is set to 3° and the representative angle of $\Delta\theta$ in the range of −1° to +1° is 0° and is represented as code "0" and when five successive occurrences of 0° exist, they are represented as code "100" when 10 successive occurrences of 0° exist, they are represented as code "1101." The code table also defines as follows: The representative angle of $\Delta\theta$ in the range of ±2° to 4° is ±3° and when the value is +, additional bit "0" is added to code "1110" and when the value is −, additional bit "1" is added to code "1110." The representative angle of $\Delta\theta$ in the range of ±5° to 7° is ±6° and additional bit indicating positive or negative is added to code "111100." The representative angle of $\Delta\theta$ in the range of ±8° to 10° is ±9° and additional bit indicating positive or negative is added to code "111101."

Thus, the above-mentioned data string is coded as follows:

"0_0_11101_100_0_0_1111000_100"→"0011101100001111000100"

At the reception party receiving the data, the data string of $\Delta\theta$ is reconstructed using the same code table as that used for coding, and processing opposite to that at the transmission party is performed for reproducing the sampling point position data.

The data is thus coded, whereby the data amount of the coded data can be reduced.

JP-A-2003-23357 mentioned above proposes a method of setting distance L2 of equal-distance resample short in a zone B where the curvature of the road shape is large and setting distance L1 of equal-distance resample long in a linear zone A with a small curvature, as shown in FIG. 28. The reason is that if a largely curved road with a large curvature is resampled at a long distance, it becomes impossible to place a sampling point at a position indicating the characteristic road shape, the reproducibility of the road shape at the reception party worsens, and the possibility that erroneous matching may occur becomes high.

Thus, the value that can be taken by resample length Lj in each zone j (quantization resample length) is preset to, for example, 40/80/160/320/640/1280/2560/5120 meters, Lj is found according to the following expression using curvature radius ρj of the zone j, and the quantization resample length closest to the value is determined the resample length Lj:

$Lj=\rho j \cdot Kr$ (where Kr is a fixed parameter)

The method disclosed in JP-A-2003-23357 mentioned above was tried using the following three prediction expressions:

Prediction expression 1: Sj=0: Deflection angle is used as it is (substantially prediction is not conducted)

Prediction expression 2: Sj=θj−1: Deflection angle of the preceding node is used Prediction expression 3: Sj=(θj−1+θj−2)/2: Deflection angle average value of the preceding and preceding preceding nodes is used Consequently, the compression efficiency of prediction expression 1 was high on average, but to examine the target roads separately, the compression efficiency of prediction expression 2 or 3 was high in some roads.

Specifically, often prediction expression 2 or 3 was suited in roads including a large number of long and gentle curves, such as an express highway; often prediction expression 1 was suited in ordinary roads.

To make a comparison between prediction expressions 2 and 3 of prediction expressions of the same kind, often prediction expression 3 compared a little favorably with prediction expression 2 in compression efficiency.

It is an object of the invention to provide a coded data generation method of efficiently compressing data and generating coded data of a road shape, etc., on a digital map and provide an apparatus for generating the coded data and decoding the coded data.

Patent document 1: JP-A-2003-23357

DISCLOSURE OF THE INVENTION

As a result of considering the above-described points, the following results were introduced:

In a "gentle curve" portion of an express highway, etc., a comparatively small curvature becomes almost constant over a long distance. Thus, focusing attention on one small zone, the curvature of the part can be very easily predicted from the upstream zone curvature. Thus, prediction expression 2 or 3 for predicting the deflection angle of the zone using the deflection angle of the preceding or preceding preceding node is suited.

Particularly, prediction expression 3 is prediction using the average curvature of the upstream preceding and preceding preceding zones, and the curvature error for each zone is smoothed. Therefore, highly accurate prediction is made possible in a "gentle curve over a long distance" as mentioned above.

However, if the curve zone is comparatively short, as compared with prediction expression 2, prediction expression 3 receives the effect of an upstream longer zone and thus prediction on the periphery of the start or end part of the curve (=periphery of the part where the curvature changes) easily fails. As the effect is received, if the curve zone is comparatively short, prediction expression 2 compares favorably with prediction expression 3 in some cases.

On the other hand, in ordinary roads, often the road is curved at right angle in an intersection, etc., or if a curve exists, a comparatively large curvature is applied only at a short distance. This means that it is difficult to predict the curvature of one small zone from the curvature of the upstream preceding zone and if the curvature of one small zone is predicted, the prediction easily fails. In such a case, prediction expression 1 of substantially conducting no prediction (using the deflection angle intact) is suited.

Taking a survey of the whole roads from the try results described above, it was seen that generally the efficiency of prediction expression 1 (using the deflection angle intact without conducting prediction) is good, but prediction expression 2 or 3 (for predicting the curvature of the corresponding point from the upstream curvature) is suited in some roads focusing attention on the discrete roads or road zones.

Based on the points described above, in the invention, in a coded data generation method of resampling a linear object having a linear shape for setting a plurality of nodes, arranging position information of each node represented by a deflection angle from the immediately preceding node to generate a data string of the deflection angles, converting the deflection angles into predicted difference values each indicating the difference from the predicted value, and variable-length coding the data string of the predicted difference values, a prediction expression to calculate the predicted value is selected from among a plurality of prediction expressions.

Thus, the prediction expression to calculate the predicted value is selected dynamically, whereby the effectiveness of data compression can be enhanced. Particularly, in the described configuration, the data string of the predicted difference values when the deflection angles are converted into the predicted difference values is evaluated and a prediction expression is selected based on the evaluation result.

The coded data generation method described above can include the following steps (1) to (6):

(1) Step of resampling a linear object for setting a plurality of nodes.

(2) Step of arranging position data of each node represented by a deflection angle from the immediately preceding node to generate a data string of the deflection angles.

(3) Step of providing a plurality of prediction expressions to calculate a predicted value of the position data of each of the nodes based on the data string of the deflection angles.

(4) Step of calculating the predicted value using a predetermined prediction expression of the plurality of prediction expressions.

(5) Step of converting the data string of the deflection angles into a data string of predicted difference values each indicating the difference from the calculated predicted value.

(6) Step of variable-length coding the data string of the predicted difference values to provide the coded data.

The coded data generation method can further include the steps of acquiring the data strings of the predicted difference values corresponding to the plurality of prediction expressions for each of the plurality of prediction expressions according to the step (5); evaluating the data strings of the predicted difference values; and selecting the predetermined prediction expression in the step (4) from among the plurality of prediction expressions based on the evaluation result of the evaluating step.

In the coded data generation method of the invention, the plurality of prediction expressions contain a prediction expression with 0 as a predicted value.

Usually, the prediction expression can be used to provide efficient data compression.

The plurality of prediction expressions can contain at least one prediction expression implemented as a function using at least one deflection angle preceding an attention deflection angle as a parameter.

In the coded data generation method of the invention, the plurality of prediction expressions contain a prediction expression with the deflection angle in the immediately preceding node as a predicted value.

If the prediction expression is used on the periphery of a gentle curve, efficient data compression can be provided.

In the coded data generation method of the invention, the plurality of prediction expressions contain a prediction expression with the average or the weighted average of a plurality of preceding deflection angles as a predicted value.

If the prediction expression is used on the periphery of a gentle curve, efficient data compression can be provided.

In the coded data generation method of the invention, the plurality of prediction expressions contain a prediction expression with the angle resulting from inverting the positive or negative sign of the deflection angle of the immediately preceding node as a predicted value.

If the resample shape is a zigzag trace, efficient data compression can be provided by using the prediction expression.

In the coded data generation method of the invention, all deflection angles contained in the data string of the deflection angles are converted into predicted difference values, the data string of the predicted difference values is evaluated, and a prediction expression to convert all deflection angles into predicted difference values is selected based on the evaluation result.

The prediction expression can be changed dynamically in the shape data units of a linear object for enhancing the data compression effectiveness.

In the coded data generation method of the invention, each deflection angle contained in the data string of the deflection angles corresponding to a part zone of the linear object is converted into a predicted difference value and the data string of the predicted difference values is evaluated, and a prediction expression to convert the deflection angles corresponding to the part zone into predicted difference values is selected based on the evaluation result.

The prediction expression can be changed dynamically at the midpoint of the shape data of the linear object for furthermore enhancing the data compression effectiveness.

In the coded data generation method of the invention, the data string of the deflection angles is classified according to state transition patterns and a prediction expression to convert the deflection angles into predicted difference values is selected in the pattern units.

To adopt the mode, the prediction expression suited for each pattern can be selected.

In the coded data generation method of the invention, the data string of the deflection angles is classified into blocks each containing a predetermined number of data pieces of the deflection angles and a prediction expression to convert the deflection angles into predicted difference values is selected for each of the blocks.

To adopt the mode, the selected prediction expression appears in the units of the given number of data pieces in the coded data, so that it becomes unnecessary to insert a marker code into the coded data.

In the coded data generation method of the invention, the data string of the deflection angles is classified into blocks matching the change points of the resample length of the resampling and a prediction expression to convert the deflection angles into predicted difference values is selected for each of the blocks.

The characteristic of the shape data often changes at the change point of the resample length. Thus, to adopt the mode, the prediction expression matching the characteristic of the shape data can be selected.

In the coded data generation method of the invention, a prediction expression to convert the attention deflection angle into a predicted difference value is selected in response to the evaluation result for the data string of the predicted difference values of a predetermined number of deflection angles preceding the attention deflection angle in the data string of the deflection angles.

The mode can be realized as both the encoding and decoding parties set a rule based on a program.

Here, as many deflection angles as the predetermined number may be converted into a plurality of data strings of predicted difference values using the plurality of selection expressions and only if the evaluation result for the data string of the predicted difference values based on a predetermined selection expression satisfies a predetermined requirement, the currently used prediction expression may be changed to the predetermined prediction expression and then the attention deflection angle may be converted into a predicted difference value.

In the attention deflection angle or block, a prediction expression may be selected with reference to the prediction expression selection state in the deflection angles or blocks preceding and following the attention deflection angle or block.

In the attention deflection angle or block, if a prediction expression different from the prediction expressions adopted in the deflection angles or blocks preceding and following the attention deflection angle or block is selected, a penalty value may be added to the evaluation value of the evaluation criterion of the predicted difference value string in the attention deflection angle or block. The penalty value can be set in response to the occurrence frequency of each prediction expression.

In the coded data generation method of the invention, the data string of the predicted difference values is evaluated according to the number of 0s contained in the data string and the prediction expression with the largest number of 0s is selected.

Thus, the data concentrates on 0 and the data compression effectiveness provided by variable-length coding is enhanced.

In the coded data generation method of the invention, the data string of the predicted difference values is evaluated according to the statistical value (variance, standard deviation, etc.,) of the predicted difference values contained in the data string and the prediction expression with the variance or standard deviation becoming the smallest is selected.

Thus, the data is statistically biased and the data compression effectiveness provided by variable-length coding is enhanced.

In the coded data generation method of the invention, the evaluation value for each predicted difference value is preset in response to the occurrence frequency of the predicted difference value and the data string of the predicted difference values is evaluated according to the sum value of the evaluation values the predicted difference values contained in the data string.

When the occurrence frequency of the predicted difference value is the evaluation value, the prediction expression with the largest sum value is selected.

When the code length of the predicted difference value is the evaluation value, the prediction expression with the smallest sum value is selected.

In the invention, a coded data generation apparatus includes a shape data resample processing section for resampling a linear object for setting a plurality of nodes and arranging position data of each node represented by a deflection angle from the immediately preceding node to generate a data string of the deflection angles; a prediction expression determination section, when the data string of the deflection angles is converted into predicted difference values indicating the difference from a predicted value to predict the position data of each of the nodes, for evaluating the data string of the predicted difference values and selecting a prediction expression to calculate the predicted value from among a plurality of prediction expressions based on the evaluation result; and a variable-length coding processing section for converting each deflection angle contained in the data string of the deflection angles generated by the shape data resample processing section into a predicted difference value from the predicted value calculated using the prediction expression determined by the prediction expression determination section and variable-length coding a data string of the predicted difference values.

The apparatus can carry out the coded data generation method described above and can efficiently compress the data amount of the coded data.

In the invention, a coded data reconstruction apparatus includes a coded data decoding section for decoding variable-length coded data representing position information of a linear object and reproducing shape data containing a data string of difference values each indicating the difference between a deflection angle and a predicted value; a prediction expression determination section for determining the prediction expression used to calculate the predicted value from the provided shape data; and a shape data reconstruction section for calculating a predicted value using the prediction expression determined by the prediction expression determination section and reproducing position information of nodes of the linear object from the data string of the predicted difference values provided by the coded data decoding section.

The apparatus can reproduce the position information of the linear object from the coded data of the position information of the linear object.

Further, the invention also contains a program for causing a computer to execute generation of code data provided by coding a linear object. The program causes the computer to execute the steps of resampling a linear object for setting a plurality of nodes and arranging position data of each node represented by a deflection angle from the immediately preceding node to generate a data string of the deflection angles; when the data string of the deflection angles is converted into predicted difference values indicating the difference from a predicted value to predict the position data of each of the nodes, evaluating the data string of the predicted difference values; selecting a prediction expression to calculate the predicted value from among a plurality of prediction expressions based on the evaluation result; and converting each deflection angle contained in the data string of the deflection angles generated by a shape data resample processing section into a predicted difference value from the predicted value calculated using the determined prediction expression and variable-length coding a data string of the predicted difference values.

Further, the invention also contains a program for causing a computer to decode code data representing a linear object. The program causes the computer to execute the steps of decoding variable-length coded data representing position information of a linear object and reproducing shape data containing a data string of difference values each indicating the difference between a deflection angle and a predicted value; determining the prediction expression used to calculate the predicted value from the provided shape data; and calculating a predicted value using the determined prediction expression and reproducing position information of nodes of the linear object from the provided data string of the predicted difference values. To generate coded data, the coded data generation method of the invention can efficiently compress data.

The apparatus of the invention can carry out the coded data generation method and can effectively compress and code the shape data of a linear object and can reconstruct the original shape data from the coded data.

BRIEF DESCRIPTION OF THE DRAWINGS

FIG. 2 is a drawing to show deflection angle strings of road shape data.

FIG. 7 shows an example of a Huffman table describing occurrence frequencies.

FIG. 27 is a drawing to show a code table used for variable-length coding.

BEST MODE FOR CARRYING OUT THE INVENTION

Figure 1:
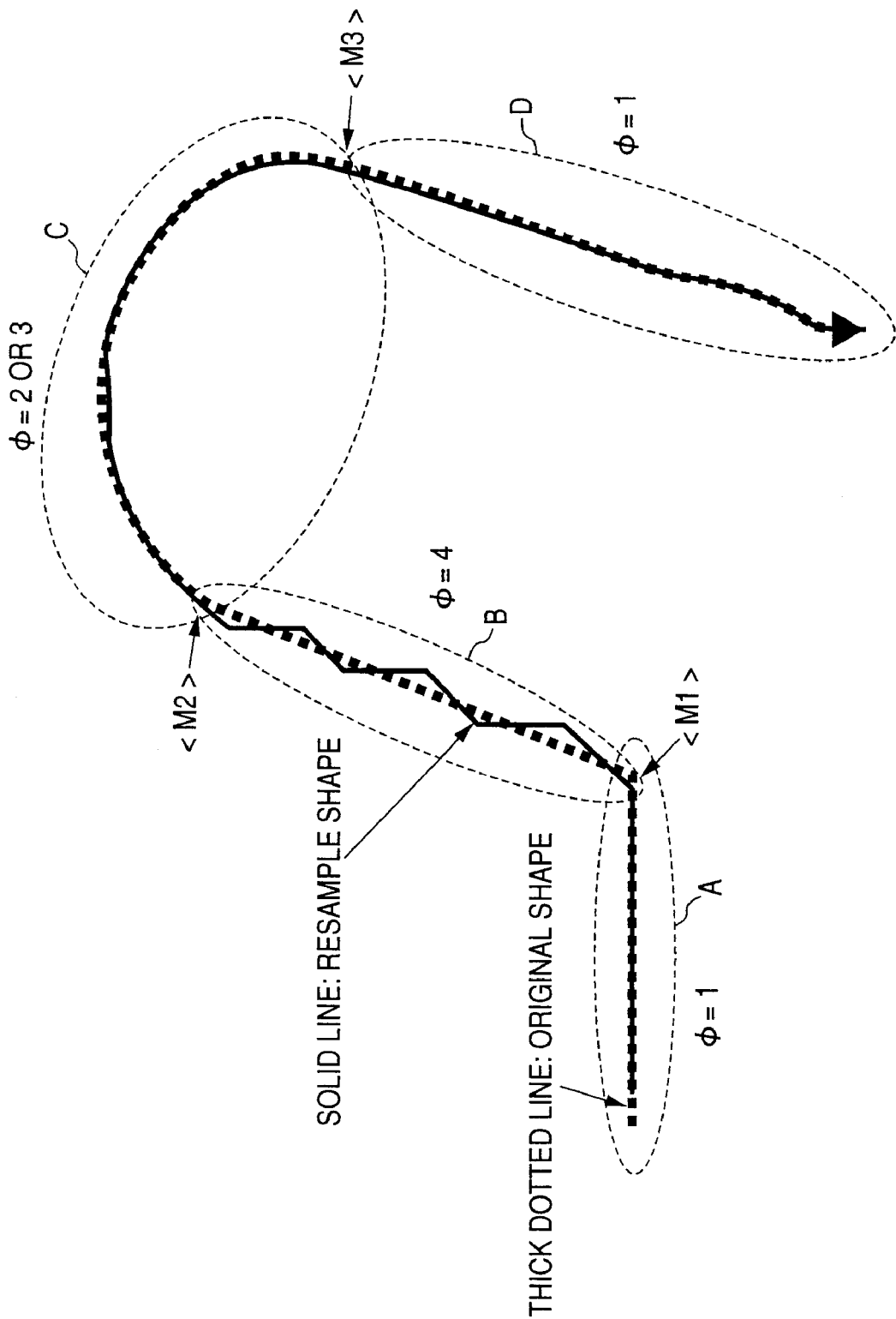
FIG. 1 is a drawing to schematically describe a coded data generation method in an embodiment of the invention.

In a coded data generation method in an embodiment of the invention, to code a road shape on a digital map of one example of a linear object and generate coded data, the coded data is generated roughly in the order of:
(a) resampling of the road shape at the resample length responsive to the curvature radius of the road
(b) conversion of position data at sampling point (node) to deflection angle $\theta$
(c) conversion of the position data represented by the deflection angle $\theta$ to a value having a statistical bias
(d) variable-length coding of the provided value.

Resampling of the road shape in (a) is executed according to the method described in JP-A-2003-23357 and the linear object is resampled for setting a plurality of nodes. For the conversion to deflection angle $\theta$ in (b), the position data of each node is represented as the angle component according to the method described in JP-A-2003-23357 and then the angle component is converted into the deflection angle $\theta$. FIGS. 2($a$), ($b$), and ($c$) show (deflection angle) data strings representing the position data in the nodes of the shape data of object roads A, B, and C (which will be hereinafter referred to as "deflection angle strings"). Each row is made up of 10 pieces of data, and the data numbers are shown at the left end. The numeral enclosed in < > in the deflection angle string is the resample length change code indicating the quantization code of the resample length, and the numeric values to the right of the code are representations each of the position data of each node provided by resampling at the resample length of the code as the deflection angle $\theta$ (deg). The position data of each node is represented as the deflection angle from the immediately preceding node, and the pieces of the position data are collected to generate the deflection angle data string.

The conversion of the position data to a value having a statistical bias in (c) is processing of adaptively using a calculation expression of a predicted value Sj (prediction expression) for predicting the value of position data to calculate Sj and converting the deflection angle $\theta$ in the deflection angle string into the difference value from the predicted value Sj (predicted difference value).

The variable-length coding in (d) is processing of variable-length coding of the predicted difference value (predicted error) of the shape data converted into predicted difference value string and is performed according to the method described in JP-A-2003-23357.

Therefore, the coded data generation method is characterized by the position data conversion processing in (c).

In the position data conversion processing in (c), any of the following four prediction expressions ($\phi=1, \phi=2, \phi=3, \phi=4$) is used to predict the predicted value Sj. The expressions are provided and are recorded in predetermined memory, etc. φ=1; prediction expression Sj=0

That is, the position data of each node j is represented as the deflection angle θj, and the predicted value is 0 φ=2; prediction expression Sj=θj−1

That is, the position data of each node j is represented as (θj−θj−1). φ=3; prediction expression Sj=(θj−1+θj−2)/2

That is, the position data of each node j is represented as {θj−(θj−1+θj−2)/2}φ=4; prediction expression Sj=−θj−1

That is, the position data of each node j is represented as (θj+θj−1).

If φ=2 or φ=3 is used when the position data of each underscored curve part in the deflection angle string in FIG. 2, high compression efficiency is provided.

φ=2, φ=3, φ=4 is implemented as a function using at least one deflection angle preceding the attention deflection angle as a parameter.

In φ=2, the deflection angle immediately preceding the attention deflection angle is used as the predicted value.

In φ=3, the average of the two deflection angles preceding the attention deflection angle is used as the predicted value. However, the number of the deflection angles preceding the attention deflection angle is arbitrary, and a weighted average like (aθj−1+bθj−2)/(a+b) may be used as the predicted value (a and b are each a real number larger than 0).

In φ=4, the angle of the deflection angle immediately preceding the attention deflection angle with the sign provided by inverting the positive or negative sign of the deflection angle immediately preceding the attention deflection angle is used as the predicted value.

Figure 3:
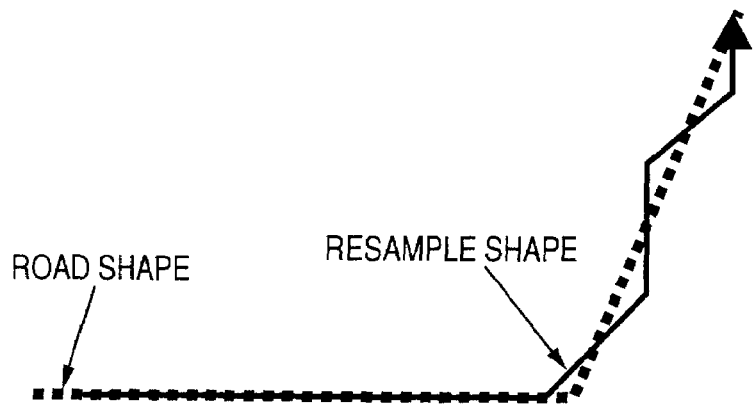
FIG. 3 is a drawing to describe a zigzag phenomenon.

As shown in FIG. 3, the resample shape (solid line) may show a zigzag in the bend part of the road shape (dotted line); if φ=4 is used when the position data of such a part is converted, high compression efficiency is provided. If the angle resolution δ at the resampling time is set and the road shape is traced, the angles that can be used are limited and thus the zigzag phenomenon inevitably occurs (inevitability involved in angle quantization). In the deflection angle string in FIG. 2(a), the position data of the parts where a zigzag phenomenon occurs are displayed as italic characters.

If φ=1 is used when the road shape is close to a line (containing the case where if a curve exists, it immediately reaches the end and the case where the road is almost a line and the angle is occasionally corrected), high compression efficiency is provided. To convert the position data of a usual road shape, φ=1 is used.

The prediction expression of the predicted value Sj used for conversion processing of the deflection angle θ is selected dynamically in response to the road shape. To select the prediction expression, (1) a mode of dynamically selecting a prediction expression for each object road (called "object road unit selection mode")

(2) a mode of detecting the pattern of the deflection angle string of the object road and selecting a prediction expression in the pattern unit (called "pattern unit selection mode")

(3) a mode of dividing the deflection angle string of the object road into blocks each made up of a given number of data pieces and selecting a prediction expression in the block unit (called "block unit selection mode")

(4) a mode of selecting a prediction expression each time the resample length change code is changed in the deflection angle string of the object road (called "resample length linkage mode")

(5) a mode of selecting a prediction expression in accordance with a program rule from the situation in the N pieces of position data upstream from the attention position data in the deflection angle string of the object road (called "sequential selection mode")

and the like are considered. Which mode is to be used needs to be predetermined between the transmission party and the reception party.

FIG. 1 schematically shows the relationship between each prediction expression selected in the resample length linkage mode and the road shape. The road shape is indicated by the dotted line, the resample shape is indicated by the solid line, and the resample length change points are indicated by <M1>, <M2>, and <M3>. φ=1 is selected in range A in which the road shape is linear; φ=4 is selected in range B in which a zigzag phenomenon occurs; φ=2 or φ=3 is selected in curve range C; and φ=1 is selected in range D in which the road shape is undetermined.

Next, the processing in each mode will be discussed in detail.

(1) Object Road Unit Selection Mode

Figure 4:
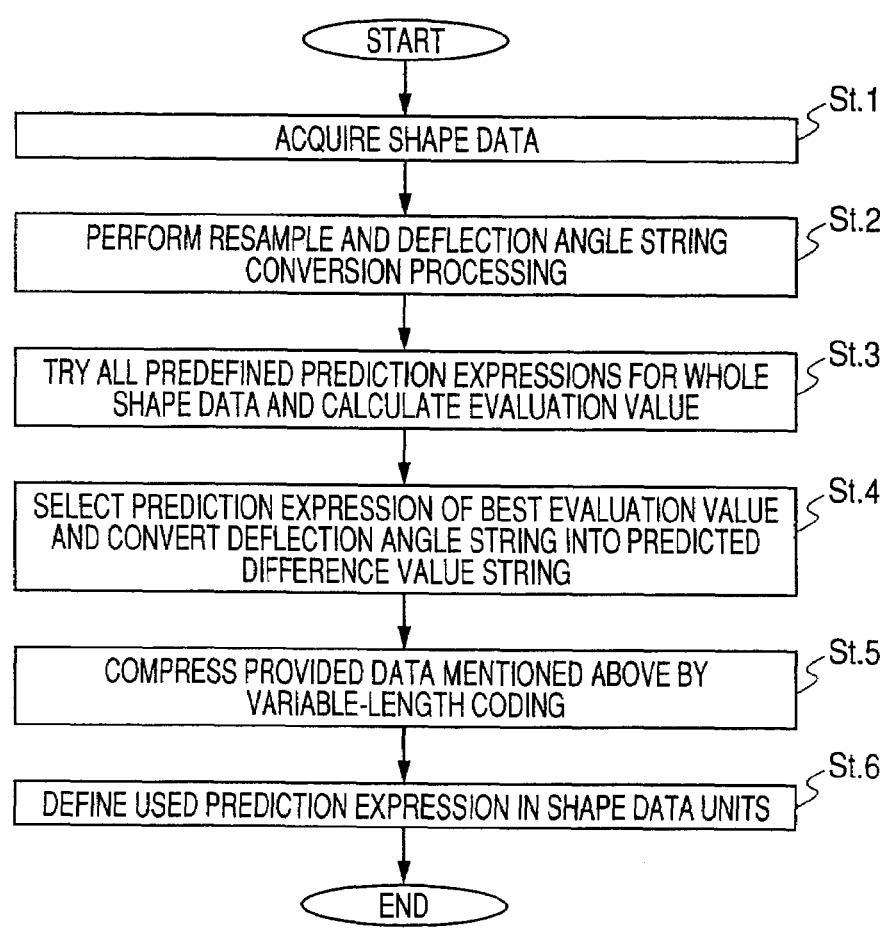
FIG. 4 is a flowchart to show a procedure of a coded data generation method in an object road unit selection mode in the embodiment of the invention.

A flowchart of FIG. 4 shows a processing procedure in the object road unit selection mode. The shape data of the object road is acquired from a digital map database (step 1), and the position data of each node generated in resample is represented as the deflection angle θ and a deflection angle string is generated (step 2).

Figure 5:
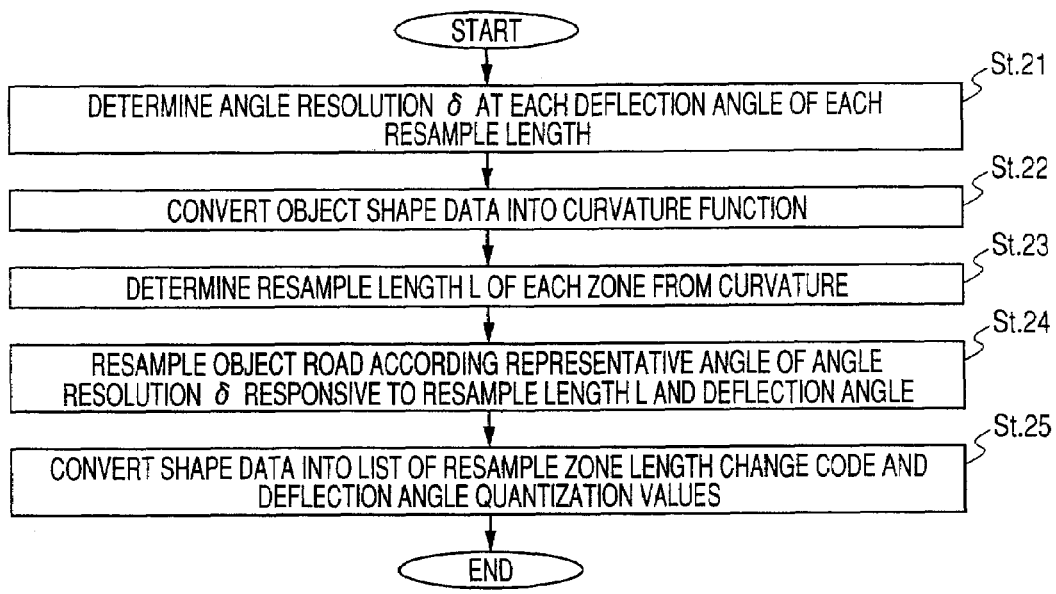
FIG. 5 is a flowchart to show a resampling and deflection angle string generation procedure in the coded data generation method in the embodiment of the invention.

The processing at step 2 is performed according to a procedure shown in FIG. 5 in detail. That is, the angle resolution δ at each deflection angle of each resample length is preset (step 21), the shape data of the object road is converted into a curvature function (step 22), and the resample length L of each zone is determined from the curvature (step 23). Next, the object road is resampled according to the representative angle of the angle resolution δ responsive to the resample length L and the deflection angle (step 24), and the shape data of the object road is converted into a deflection angle string of a list of resample zone length change code and deflection angle quantization values (step 25).

Upon completion of generation of the deflection angle string, the prediction expressions φ=1, φ=2, φ=3, and φ=4 are applied to the whole deflection angle string of the object road, the deflection angle θ in the deflection angle string is converted into the difference value from the predicted value Sj (predicted difference value), and which prediction expression is optimum is determined (step 3). The processing at step 3 is performed according to a procedure shown in FIG. 6 in detail. That is, the deflection angle string to be evaluated (in the object road unit selection mode, the whole deflection angle string of the object road) is acquired (step 31), the prediction expressions are used in order starting at φ=1 (step 32), the predicted value Sj is calculated according to each prediction expression, the deflection angle θ in the deflection angle string is converted into a predicted difference value string represented as predicted difference value (=Aθj=θj−Sj) (step 33), and the evaluation value of the deflection angle string is calculated (step 34).

The evaluation value is calculated as below in (i) to (iii):

(i) The number of 0s contained in the predicted difference value string is used as the evaluation value and higher evaluation is given to the predicted difference value string having a larger number of 0s (the prediction expression containing the greatest number of 0s is selected).

(ii) The calculation value of the statistical value of data contained in the predicted difference value string (for example, variance, standard deviation, etc.,) is used as the evaluation value and higher evaluation is given to the predicted difference value string having smaller variance or standard deviation.

(iii) The score responsive to the occurrence frequency is preset in data appearing in the predicted difference value string, the cumulative value resulting from adding the scores of the data appearing in the predicted difference value string to be evaluated is used as the evaluation value, and evaluation responsive to the cumulative value is given. In a Huffman table in FIG. 7, the occurrence frequency (or occurrence probability) of each angle is described and shorter code is assigned to the angle having the higher occurrence frequency. To add the value of the corresponding occurrence frequency in the table in response to the angle appearing in the predicted difference value string to be evaluated, the cumulative value is used as the evaluation value and higher evaluation is given to the predicted difference value string having the higher cumulative value. To add the code length of the angle in response to the angle appearing in the predicted difference value string to be evaluated, the cumulative value is used as the evaluation value and higher evaluation is given to the predicted difference value string having the smaller cumulative value. Such a score table corresponding to the occurrence frequencies is previously possessed, whereby the evaluation in (iii) is also possible if variable-length coding other than the Huffman coding is performed.

All prediction expressions are used to perform the processing at steps 33 and 34 and upon completion of the processing (step 35, 36), the prediction expression of the best evaluation value is determined (step 37). That is, for each of the prediction expressions $\phi=1$, $\phi=2$, $\phi=3$, and $\phi=4$, the corresponding predicted difference data value string is generated and the data strings are evaluated.

The prediction expression of the best evaluation value is thus selected and the deflection angle $\theta$ in the deflection angle string is converted into the predicted difference value from the predicted value calculated according to the prediction expression (step 4) and the whole shape data converted into the predicted difference value string is compressed by variable-length coding (step 5). The used prediction expression is defined for the provided coded data (step 6).

Figure 8:
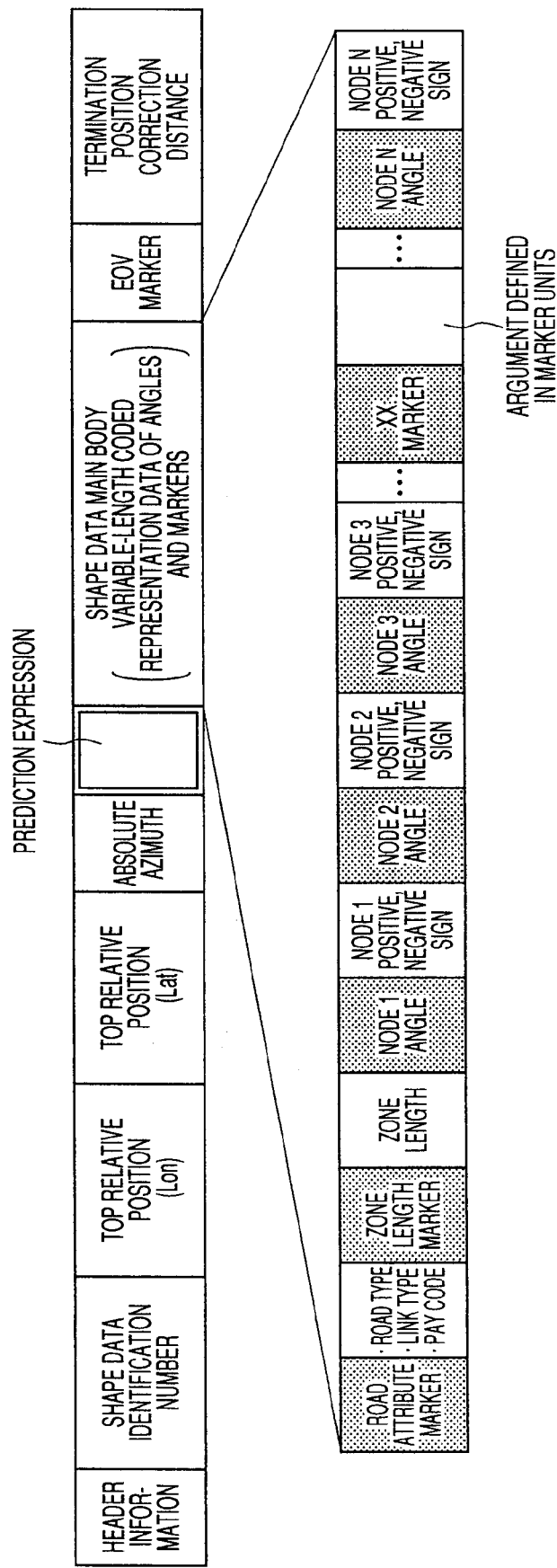
FIG. 8 shows a data format example of coded data generated in the object road unit selection mode in the embodiment of the invention.

FIG. 8 shows the data format of the coded data generated according to the object road unit selection mode. Here, the data representing the used prediction expression is inserted before the shape data main body of the object road.

Figure 9:
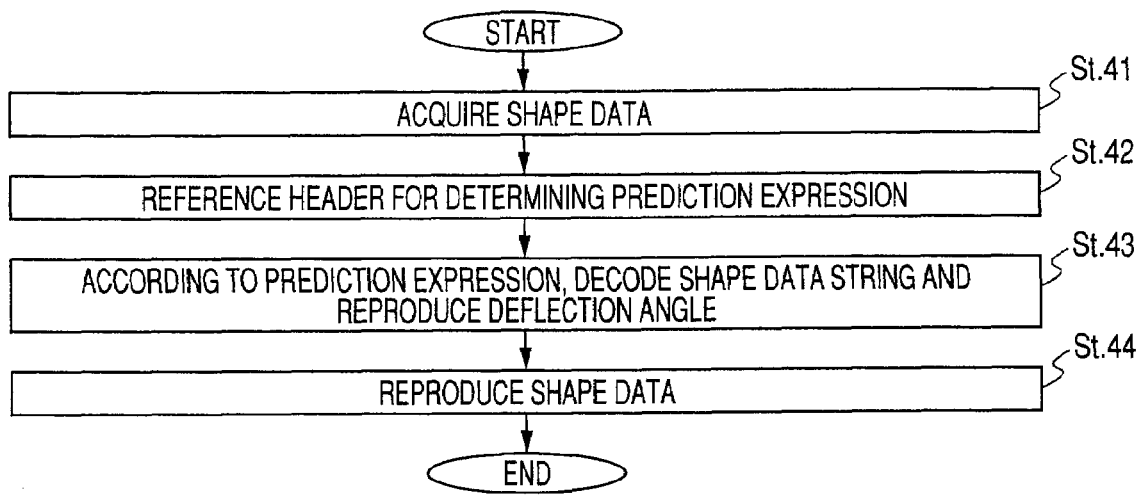
FIG. 9 is a flowchart to show a decoding procedure of coded data generated in the object road unit selection mode in the embodiment of the invention.

A flowchart of FIG. 9 shows a processing procedure of reproducing the shape data of the object road from the coded data. The shape data subjected to the variable-length decoding processing is taken out from the coded data (step 41), a header is referenced for determining the prediction expression (step 42), the angle data read from the shape data is converted into the deflection angle according to the prediction expression (step 43), and the shape data of the object road is reproduced (step 44).

(2) Pattern Unit Selection Mode

Figure 10:
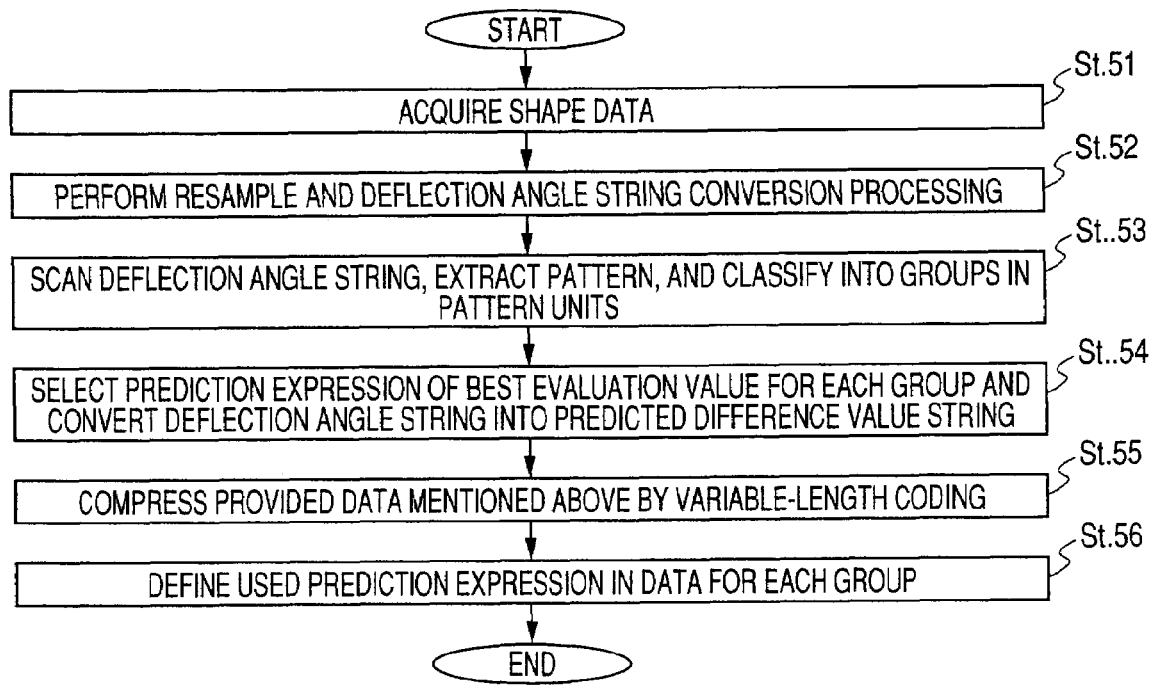
FIG. 10 is a flowchart to show a procedure of a coded data generation method in a pattern unit selection mode in the embodiment of the invention.

A flowchart of FIG. 10 shows a processing procedure in the pattern unit selection mode. Shape data acquiring (step 51) and resample and deflection angle string conversion processing (step 52) are similar to those in the object road unit selection mode (FIGS. 4 and 5).

The provided deflection angle string is scanned, a curve pattern (underscore portion in FIG. 2) to which $\phi=2$ or $\phi=3$ is to be applied where P or more data pieces of non-0 having the same positive or negative sign are successive or a zigzag pattern (italic portion in FIG. 2(a)) to which $\phi=4$ is to be applied where Q or more data pieces of the same absolute value with an alternating pattern of positive and negative signs are successive is extracted, and the deflection angle string data is classified into pattern groups and a group not belonging to any patterns to which $\phi=1$ is to be applied (step 53). The prediction expression of the best evaluation value is selected for each group and the deflection angle string is converted into a predicted difference value string (step 54). At this time, if the best prediction expression corresponding to one group is not uniquely determined, a plurality of prediction expressions are applied to the deflection angle string of the group and the prediction expression of the best evaluation value is determined according to the procedure in FIG. 6.

Next, the whole shape data converted into the predicted difference value string is compressed by variable-length coding (step 55), and the used prediction expression is defined for the provided coded data for each group (step 56).

In the embodiment, the deflection angle data strings are classified into blocks (groups) corresponding to state transition patterns of the deflection angles. The optimum prediction expression is selected for each block.

Figure 11:
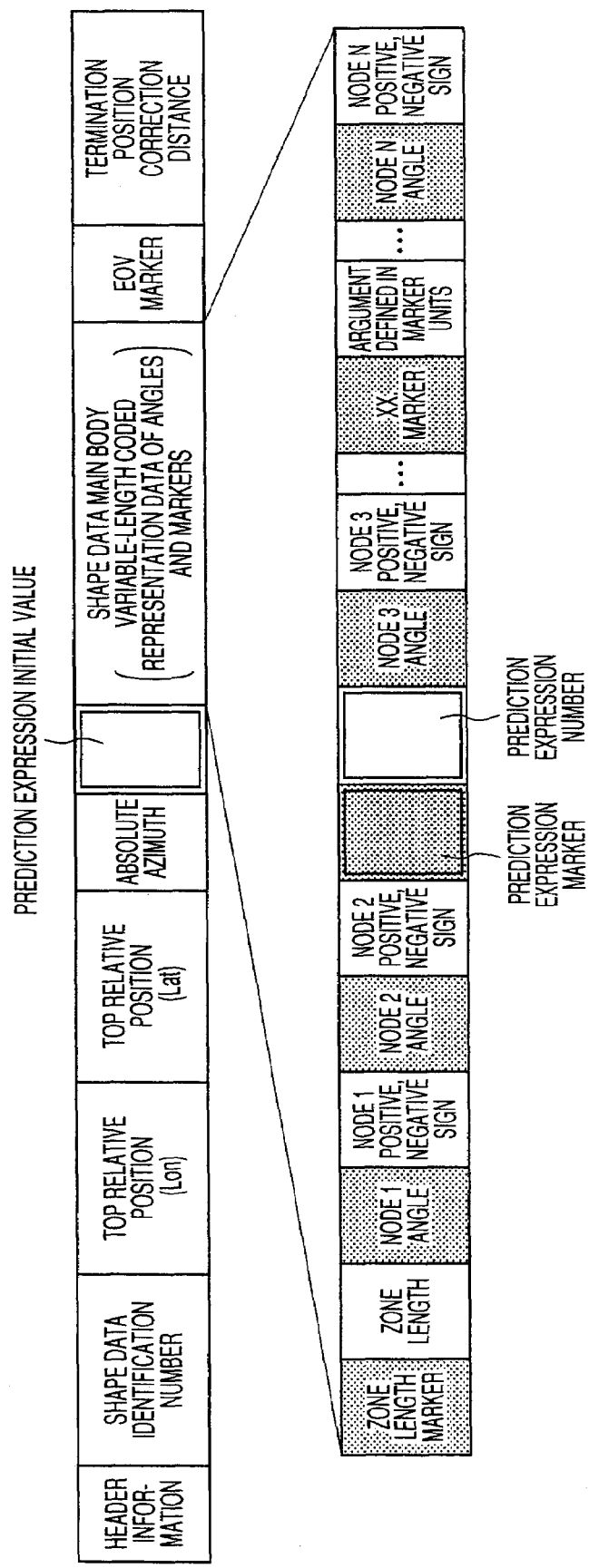
FIG. 11 shows a data format example of coded data generated in the pattern unit selection mode in the embodiment of the invention.

FIG. 11 shows the data format of the coded data generated according to the pattern unit selection mode. Here, the prediction expression initial value representing the prediction expression used in the first group is inserted before the shape data main body of the object road, and preceding the position data of each subsequent group, a prediction expression marker indicating prediction expression insertion and the prediction expression number of the prediction expression used in the group are inserted.

Figure 12:
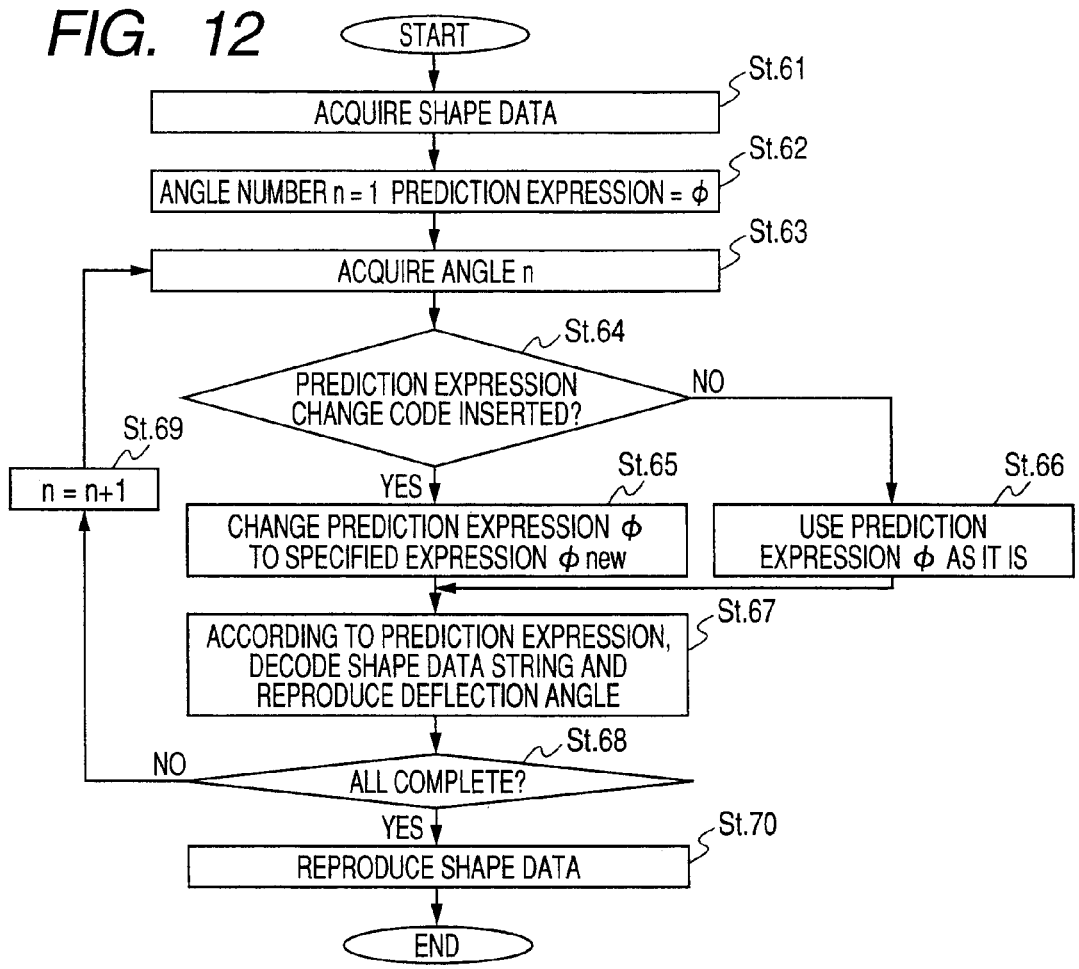
FIG. 12 is a flowchart to show a decoding procedure of coded data generated in the pattern unit selection mode in the embodiment of the invention.

A flowchart of FIG. 12 shows a processing procedure of reproducing the shape data of the object road from the coded data (decoding method of the coded data). The shape data subjected to the variable-length decoding processing is taken out from the coded data (step 61), the number of the angle data read from the shape data is set to the initial value and the first used prediction expression is set to the prediction expression represented by the prediction expression initial value (step 62), the corresponding angle data is read from the shape data (step 63), and whether or not prediction expression change code is inserted before the angle data is determined (step 64). If prediction expression change code is not inserted, the setup prediction expression is used as it is (step 66), and the angle data is converted into the deflection angle according to the prediction expression (step 67). If prediction expression change code is inserted, the prediction expression is changed to a new prediction expression specified by the code (step 65), and the angle data is converted into the deflection angle according to the prediction expression (step 67). Such processing is performed for all angle data (steps 68 and 69) and the shape data of the object road is reproduced (step 70).

In the mode, the data string of the deflection angles corresponding to a part zone of the linear object (road shape) rather than the whole is converted into a data string of the predicted difference values and the optimum prediction expression for converting the deflection angles corresponding to the part zone into the predicted difference values is selected based on the evaluation result of the data string of the predicted difference values. This philosophy is adopted common to the modes in (3) to (5) described below.

(3) Block Unit Selection Mode

Figure 13:
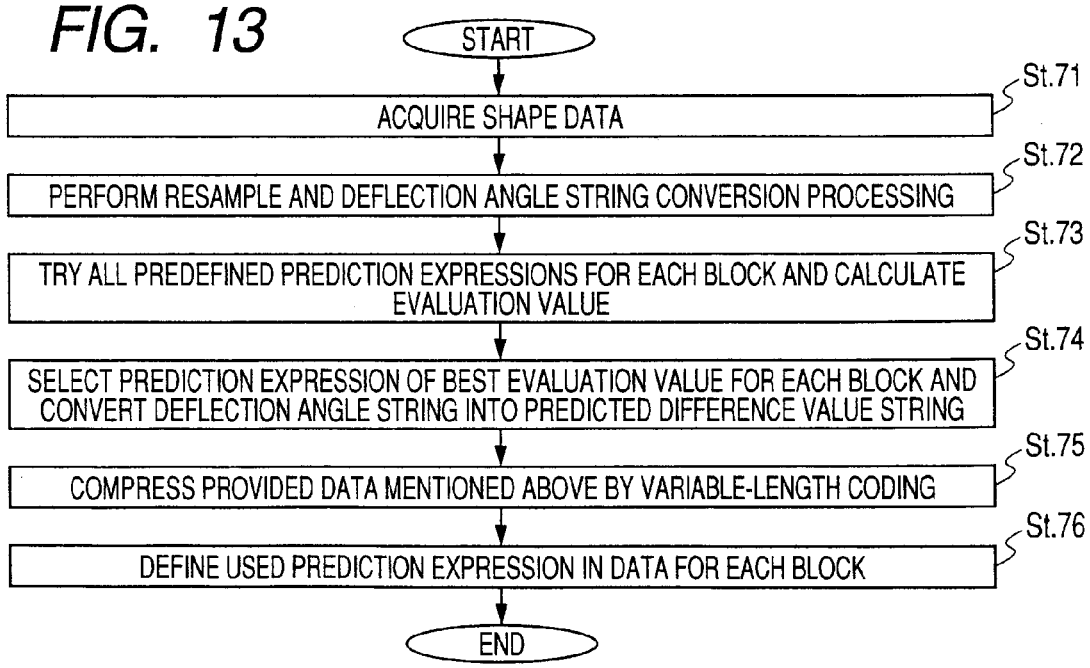
FIG. 13 is a flowchart to show a procedure of a coded data generation method in a block unit selection mode in the embodiment of the invention.

A flowchart of FIG. 13 shows a processing procedure in the block unit selection mode. Shape data acquiring (step 71) and resample and deflection angle string conversion processing (step 72) are similar to those in the object road unit selection mode (FIGS. 4 and 5).

Figure 6:
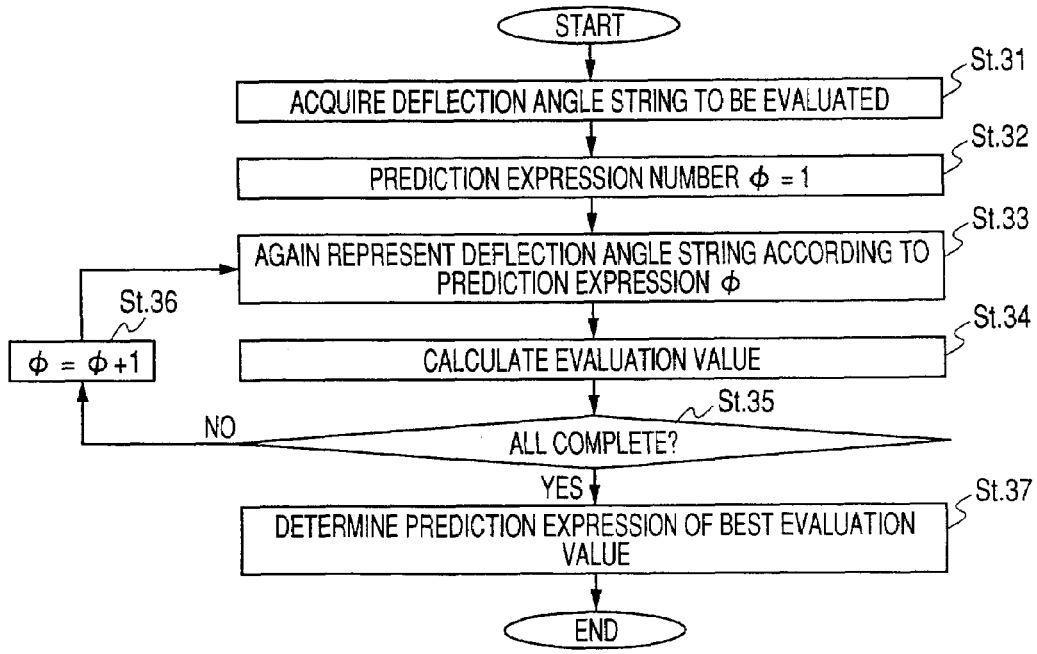
FIG. 6 is a flowchart to show an evaluation value calculation procedure in the coded data generation method in the embodiment of the invention.

For example, one block is made up of 10 pieces of data on one row of the deflection angle string shown in FIG. 2, the prediction expressions ϕ=1, ϕ=2, ϕ=3, and ϕ=4 are applied to the deflection angle string in the block units for converting the deflection angle θ in the deflection angle string into predicted difference values, and which prediction expression is optimum is determined (step 73). The evaluation method is the same as that in the object road unit selection mode (FIG. 6). The prediction expression of the best evaluation value is selected for each block and the deflection angle string is converted into a predicted difference value string (step 74), the whole shape data converted into the predicted difference value string is compressed by variable-length coding (step 75), and the used prediction expression is defined for the provided coded data for each block (step 76).

Figure 14:
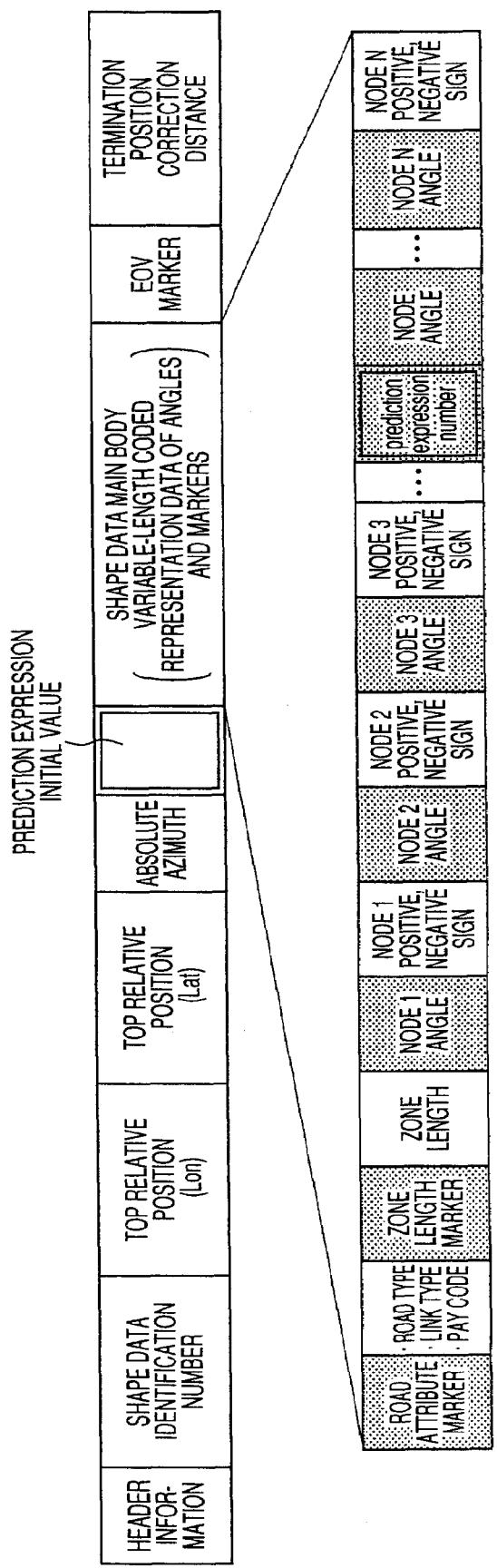
FIG. 14 shows a data format example of coded data generated in the block unit selection mode in the embodiment of the invention.

FIG. 14 shows the data format of the coded data generated according to the block unit selection mode. Here, the prediction expression initial value representing the prediction expression used in the first block is inserted before the shape data main body of the object road, and preceding the position data of each subsequent block, the prediction expression number is inserted. Since the insertion position of the prediction expression number is automatically determined by the number of data pieces contained in the block, a prediction expression marker need not be inserted.

Figure 15:
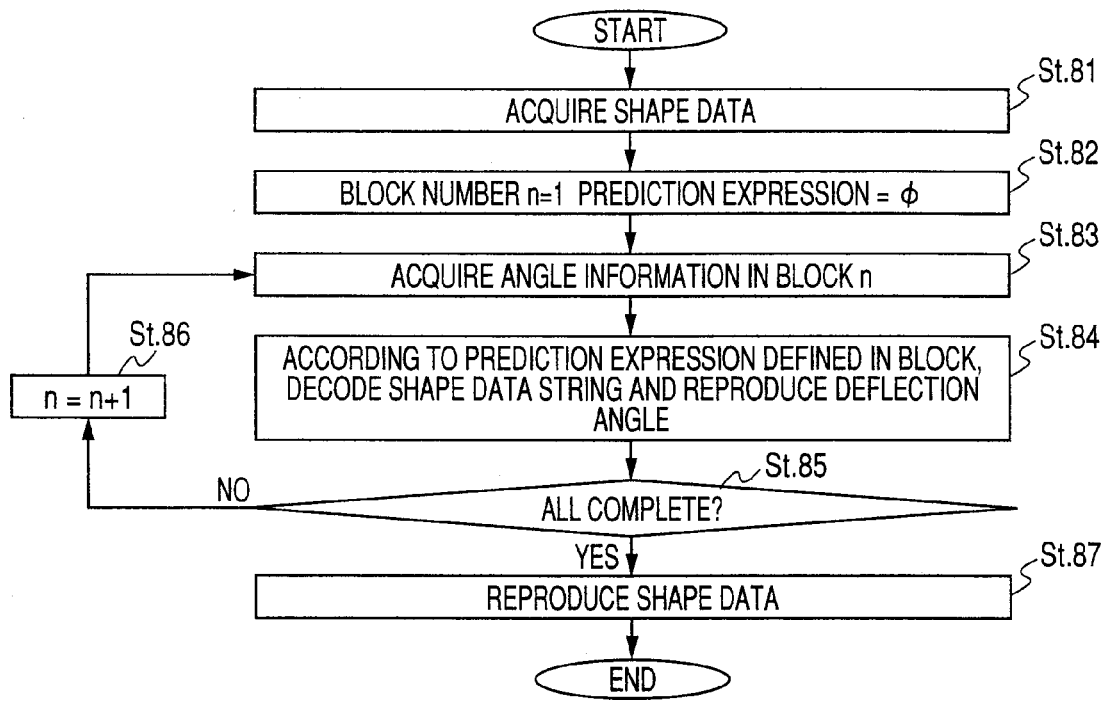
FIG. 15 is a flowchart to show a decoding procedure of coded data generated in the block unit selection mode in the embodiment of the invention.

A flowchart of FIG. 15 shows a processing procedure of reproducing the shape data of the object road from the coded data. The shape data subjected to the variable-length decoding processing is taken out from the coded data (step 81), the number of the block read from the shape data is set to the initial value and the first used prediction expression is set to the prediction expression represented by the prediction expression initial value (step 82), the angle data in the block is read from the shape data (step 83), and the angle data is converted into the deflection angle according to the prediction expression defined in the block (step 84). Such processing is performed for all blocks (steps 85 and 86) and the shape data of the object road is reproduced (step 87).

In the mode, the predetermined number of data pieces of the deflection angles contained in one block is 10, but the number can be changed as desired.

(4) Resample Length Linkage Mode

Figure 16:
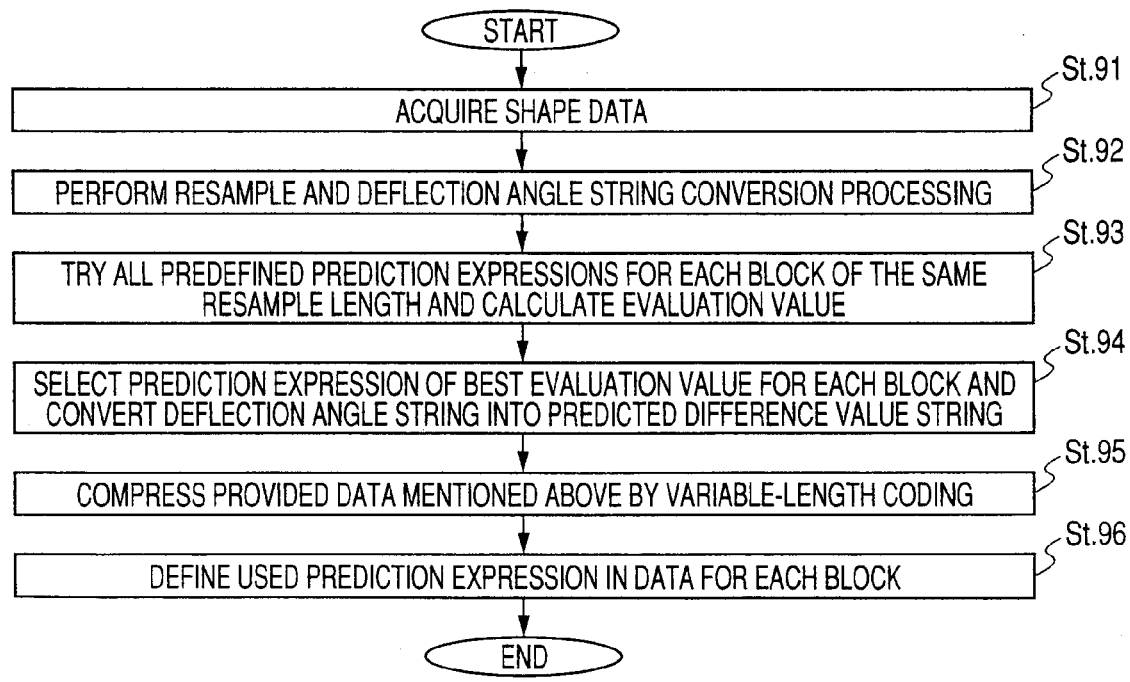
FIG. 16 is a flowchart to show a procedure of a coded data generation method in a resample length linkage mode in the embodiment of the invention.

A flowchart of FIG. 16 shows a processing procedure in the resample length linkage mode. Shape data acquiring (step 91) and resample and deflection angle string conversion processing (step 92) are similar to those in the object road unit selection mode (FIGS. 4 and 5).

In the deflection angle string shown in FIG. 2, the angle data existing between one resample length change code and the next resample length change code (two resample length change points), resampled at the same resample length is one block (block between the numerals enclosed in < >), the prediction expressions ϕ=1, ϕ=2, ϕ=3, and ϕ=4 are applied to the deflection angle string in the block units for converting the deflection angle θ in the deflection angle string into predicted difference values, and which prediction expression is optimum is determined (step 93). The evaluation method is the same as that in the object road unit selection mode (FIG. 6). The prediction expression of the best evaluation value is selected for each block and the deflection angle string is converted into a predicted difference value string (step 94), the whole shape data converted into the predicted difference value string is compressed by variable-length coding (step 95), and the used prediction expression is defined for the provided coded data for each block (step 96).

Figure 17:
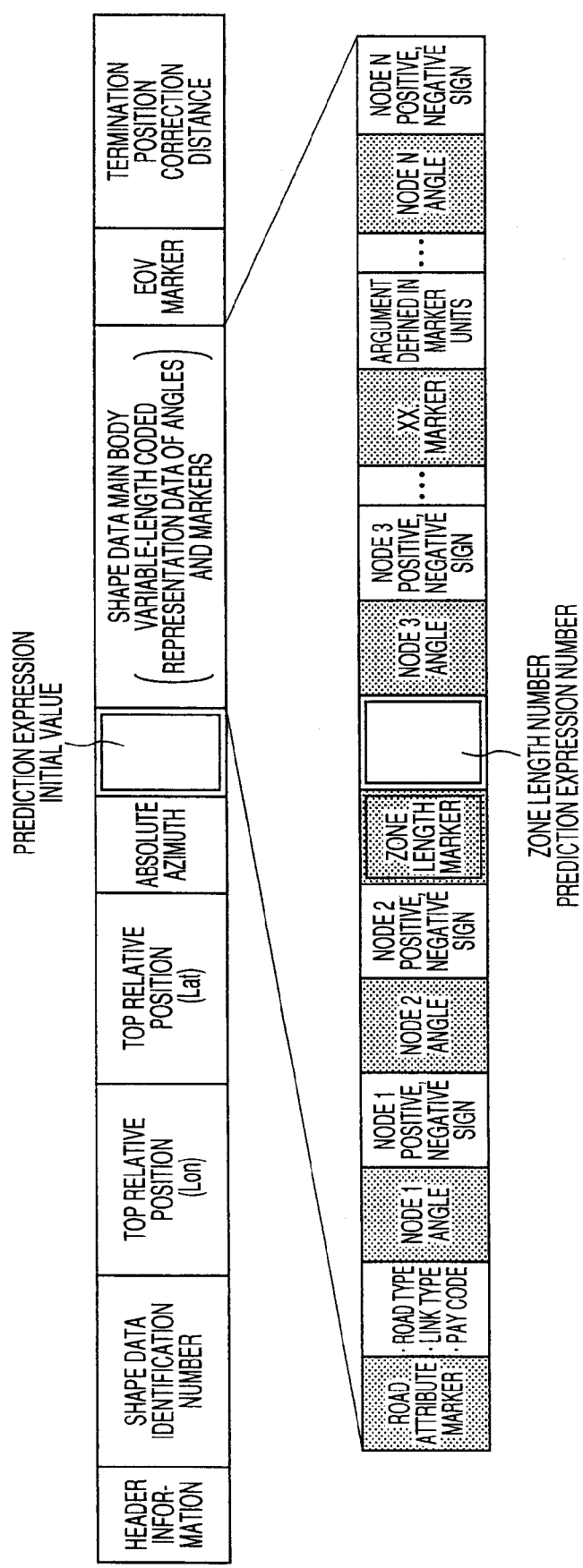
FIG. 17 shows a data format example of coded data generated in the resample length linkage mode in the embodiment of the invention.

FIG. 17 shows the data format of the coded data generated according to the resample length linkage mode. Here, the prediction expression initial value representing the prediction expression used in the first block is inserted before the shape data main body of the object road, and the prediction expression number of the prediction expression used in each subsequent block is defined in zone length information following a zone length marker, inserted into the start position of the angle data resampled at the same resample length.

Figure 18:
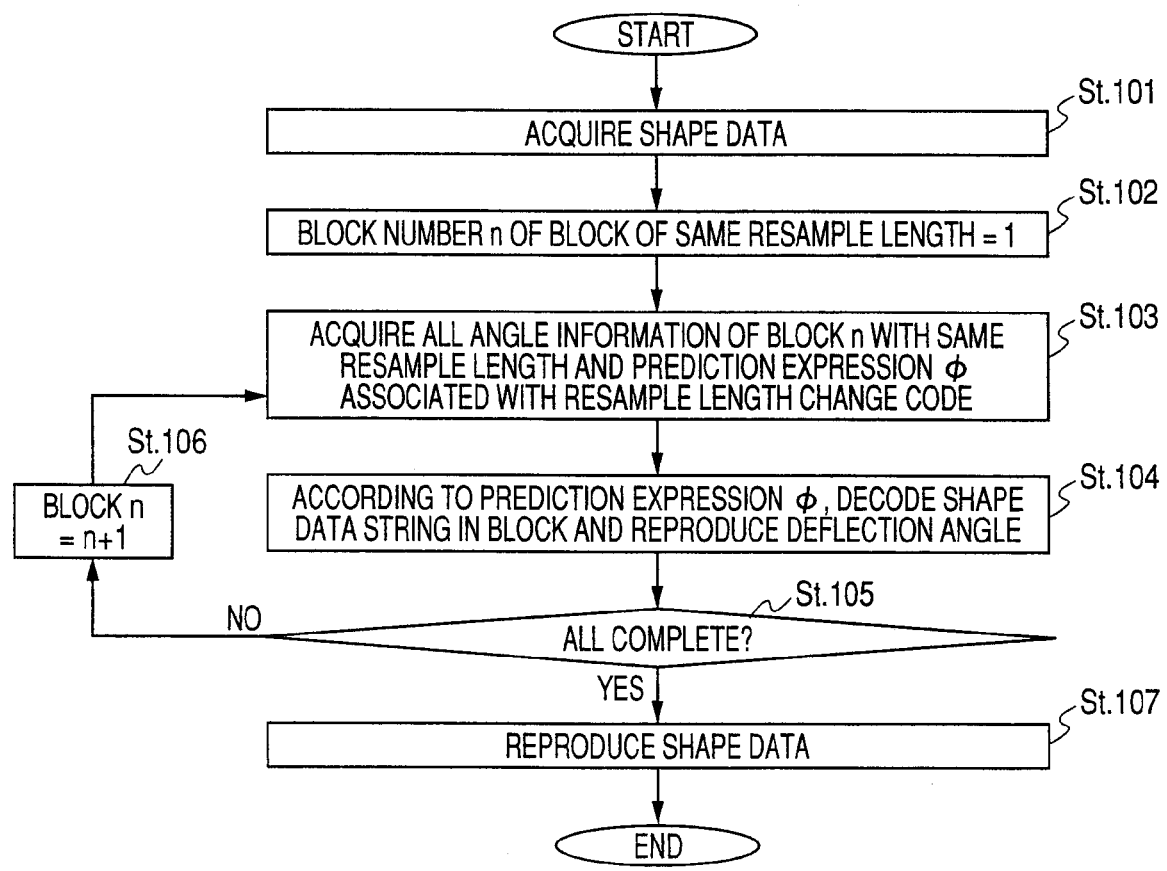
FIG. 18 is a flowchart to show a decoding procedure of coded data generated in the resample length linkage mode in the embodiment of the invention.

A flowchart of FIG. 18 shows a processing procedure of reproducing the shape data of the object road from the coded data. The shape data subjected to the variable-length decoding processing is taken out from the coded data (step 101), the number of the block of the same resample length read from the shape data is set to the initial value (step 102), all angle data contained in the block with the same resample length and the prediction expression associated with the resample length change code are acquired (step 103), and the angle data in the block is converted into the deflection angle according to the prediction expression (step 104). Such processing is performed for all blocks each with the same resample length (steps 105 and 106) and the shape data of the object road is reproduced (step 107).

(5) Sequential Selection Mode

Figure 19:
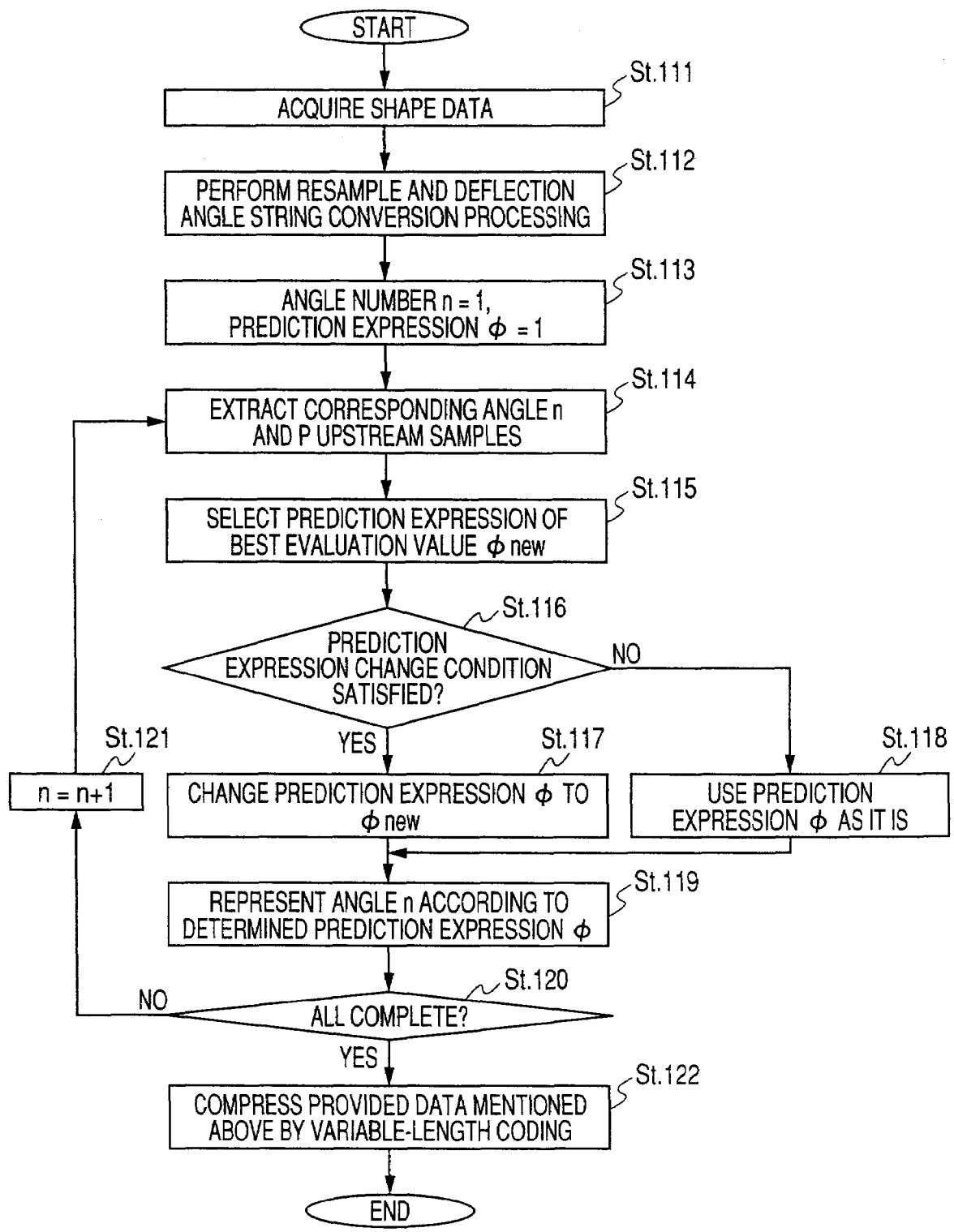
FIG. 19 is a flowchart to show a procedure of a coded data generation method in a sequential selection mode in the embodiment of the invention.

A flowchart of FIG. 19 shows a processing procedure in the sequential selection mode. Shape data acquiring (step 111) and resample and deflection angle string conversion processing (step 112) are similar to those in the object road unit selection mode (FIGS. 4 and 5).

The number of angle data extracted from a deflection angle string is set to initial value and the first used prediction expression is set to ϕ=1 (step 113). The corresponding angle data and a predetermined number of (here, P) samples upstream from the angle data are extracted from the deflection angle string (step 114), the prediction expressions ϕ=1, ϕ=2, ϕ=3, and ϕ=4 are applied to the deflection angle string made up of the extracted data for converting the deflection angle θ in the deflection angle string into predicted difference values, and prediction expression of the best evaluation value ϕnew is selected (step 115). The evaluation method is the same as that in the object road unit selection mode (FIG. 6).

Based on the evaluation result, whether or not the already setup prediction expression needs to be changed is determined according to the prediction expression change condition (step 116). That is, in the mode, while the upstream shape of the position data to be coded is referenced, whether or not the optimum prediction expression used for the position data is to be changed is determined.

As the change condition, for example, the following (i) or (iii) condition is set:

(i) If evaluation value difference Δ between the currently used prediction expression ϕ and the prediction expression ϕnew is greater than a predetermined value, the prediction expression is changed.

(ii) If a state in which higher evaluation is given to the prediction expression ϕnew rather than the currently used prediction expression ϕ continues Q times or more, the prediction expression is changed.

If the change condition is not satisfied, the already setup prediction expression is used as it is (step 118), and the angle data is converted into predicted difference value (step 119). If the change condition is satisfied, the prediction expression is changed to the prediction expression ϕnew (step 117), and the angle data is converted into predicted difference value (step 119). Such processing is performed for all angle data (steps 120 and 121) and the whole shape data converted into the predicted difference value string is compressed by variable-length coding (step 122).

The prediction expression change rule is determined in the program defining the coding processing.

In the embodiment, a prediction expression for converting the attention deflection angle into the predicted difference value is selected in response to the evaluation result for the data string of the predicted difference values of the predetermined number of (P) deflection angles preceding the attention deflection angle. Further, only if the evaluation result satisfies the predetermined requirement, the currently used prediction expression is changed to a predetermined prediction expression.

Figure 20:
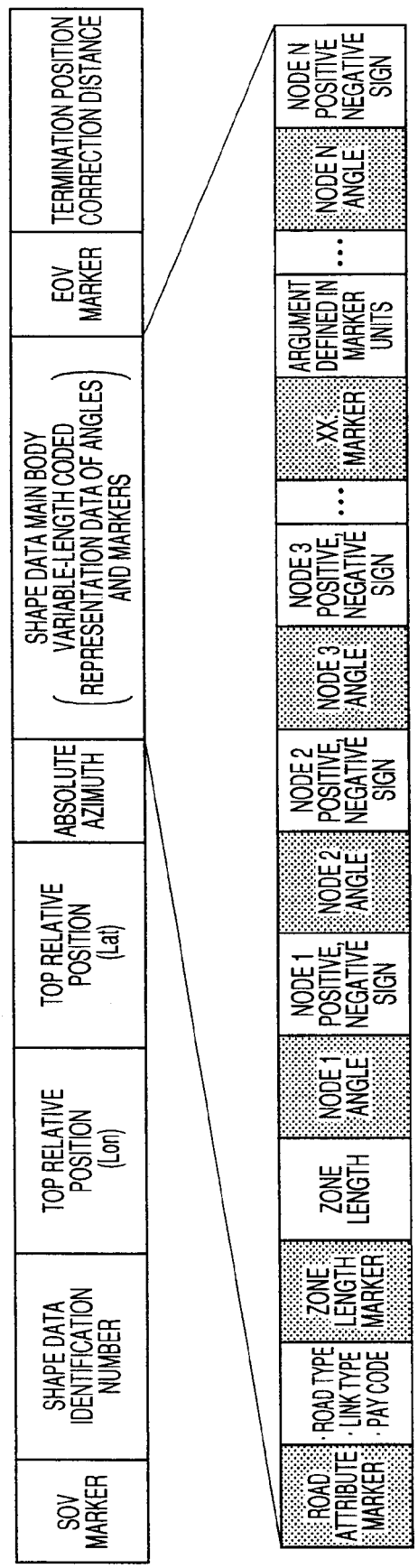
FIG. 20 shows a data format example of coded data generated in the sequential selection mode in the embodiment of the invention.

FIG. 20 shows the data format of the coded data generated according to the sequential selection mode. Since the coded data does not contain information specifying a prediction expression, the data amount is also small. The prediction expression used in decoding is selected based on the rule of the program defining the decoding of the coded data.

Figure 21:
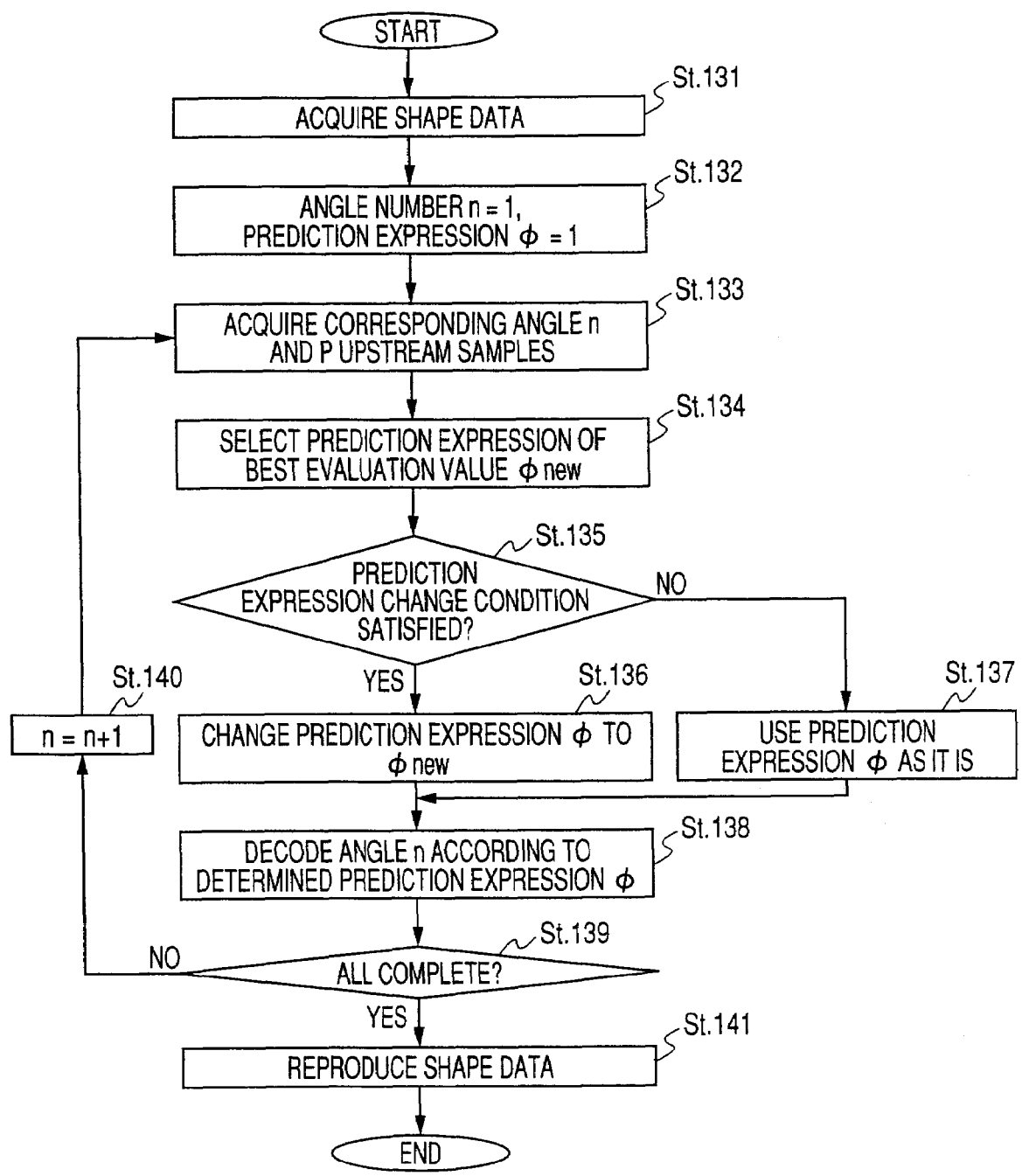
FIG. 21 is a flowchart to show a decoding procedure of coded data generated in the sequential selection mode in the embodiment of the invention.

A flowchart of FIG. 21 shows a processing procedure of reproducing the shape data of the object road from the coded data. The shape data subjected to the variable-length decoding processing is taken out from the coded data (step 131), the number of the angle data read from the shape data is set to the initial value, and the first used prediction expression is set to $\phi=1$ (step 132). The corresponding angle data and the P samples upstream from the angle data are read (step 133), the prediction expressions $\phi=1$, $\phi=2$, $\phi=3$, and $\phi=4$ are applied to the deflection angle string made up of the read data for converting the deflection angle $\theta$ in the deflection angle string into predicted difference values, and prediction expression of the best evaluation value $\phi$new is selected (step 134). Next, based on the evaluation result, whether or not the already setup prediction expression needs to be changed is determined according to the prediction expression change condition (step 135). If the change condition is not satisfied, the already setup prediction expression is used as it is (step 137), and the angle data is converted into a deflection angle according to the prediction expression (step 138). If the change condition is satisfied, the prediction expression is changed to the prediction expression $\phi$new (step 136), and the angle data is converted into a deflection angle according to the prediction expression (step 138). Such processing is performed for all angle data (steps 139 and 140) and the shape data of the object road is reproduced (step 141).

Thus, to generate the coded data of the road shape, the prediction expression used for calculating the predicted value to convert the position data into a predicted difference value is selected adaptively for each road or for each road portion, whereby the data amount of the coded data can be compressed efficiently.

By the way, in the modes in (1) to (4) described above, to change the prediction expression in one shape data, it becomes necessary to incorporate information of "explicitly describing prediction expression change and specifying the prediction expression ID" in data. This can result in one factor of an increase in the data amount. Further, for example, when "although generally prediction expression 1 is good in the whole road zone, another prediction expression is good instantaneously," it is not much desirable to frequently change the prediction expression. To at least change the prediction expression, it is desirable that "the data amount reduction effect provided by adopting a new prediction expression" should be over "the loss involved in changing the prediction expression."

Then, it is considered that "change penalty" is added to "the evaluation value provided by each prediction expression" and "whether or not the prediction expression is to be changed" is determined according to the evaluation result. In other words, it is considered that the prediction expression change is provided with hysteresis.

FIG. 22 is a drawing to show a total evaluation method of the evaluation values provided by the prediction expressions and the change penalty involved in changing the prediction expression.

Figure 22A:
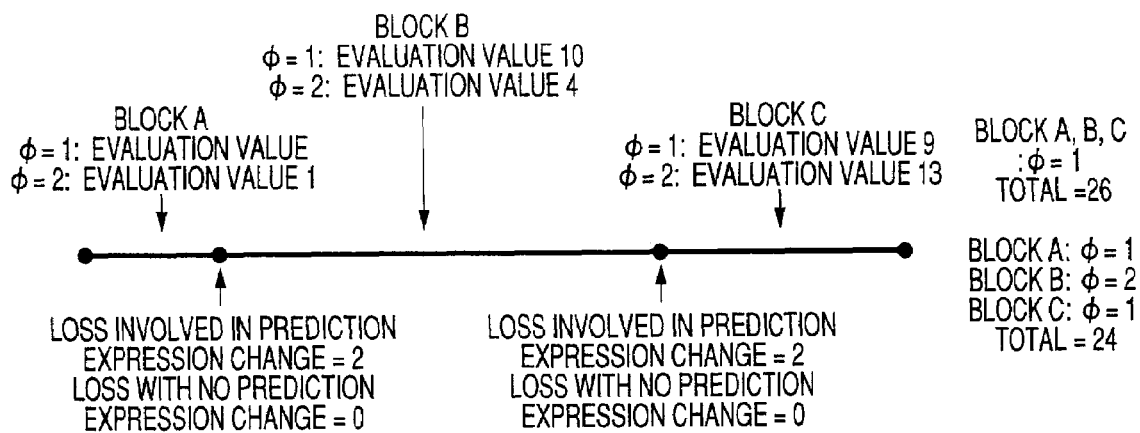
FIG. 22 is a drawing to show a total evaluation method of the evaluation values provided by prediction expressions and the change penalty involved in changing the prediction expression.
Figure 22B:
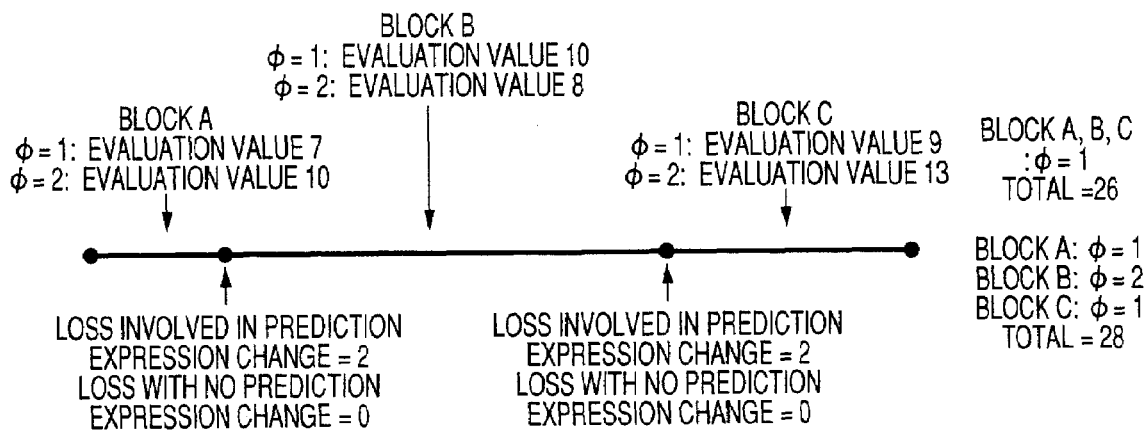

In FIG. 22(a), as the prediction expression is changed, the data amount can be reduced and the data transmission efficiency can be enhanced and therefore the prediction expression is changed. On the other hand, in FIG. 22(b), as the prediction expression is not changed, good transmission efficiency is provided and therefore the prediction expression is not changed.

If the numbers of data classification blocks and deflection angles increase, a combination optimization problem such that "what combination is most efficient?" occurs. As the numbers of blocks and deflection angles increase, it becomes difficult to find out an optimal solution easily and rapidly.

Then, as a method of finding out a quasi-optimal solution rapidly, the following two modes are possible:

(i) The change penalty is made relatively small for a highly frequently occurring prediction expression and is made large for a less frequently occurring prediction expression. If a less frequently occurring prediction expression is adopted, the possibility that the prediction expression may be changed to another prediction expression in the next block is large and therefore change to the less frequently occurring prediction expression is suppressed.

(ii) Usually, processing is performed in order in one direction and thus the downstream situation is estimated from the upstream result of the attention block and the change penalty is changed dynamically.

Further, it is considered that the optimum prediction expression occurrence frequency changes according to the compression rate. For example, if the compression rate is raised, there is a trend for the regularity of the deflection angles to disappear and for $\phi=1$ to become an optimum expression. In contrast, if the compression rate is lowered, there is a trend to enhance the regularity of the deflection angles and for $\phi=2$ or $\phi=3$ to become an optimum expression.

Therefore, in (i), it is considered that a method of "once calculating the evaluation value of each prediction expression for the whole shape data and determining the change penalty in response to the evaluation value" is good.

Figure 23:
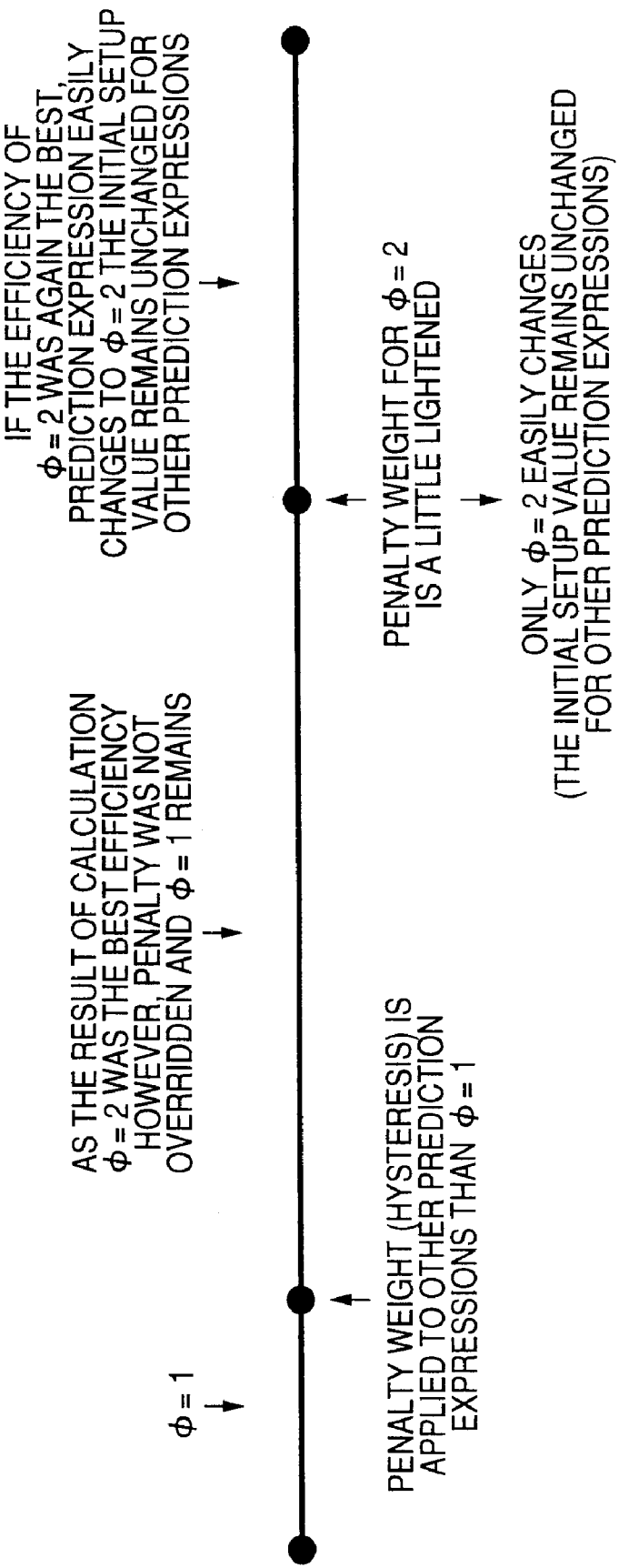
FIG. 23 is a drawing to show a method of dynamically varying the change penalty involved in changing the prediction expression.

FIG. 23 is a drawing to show a method of dynamically varying the change penalty involved in changing the prediction expression.

Figure 24:
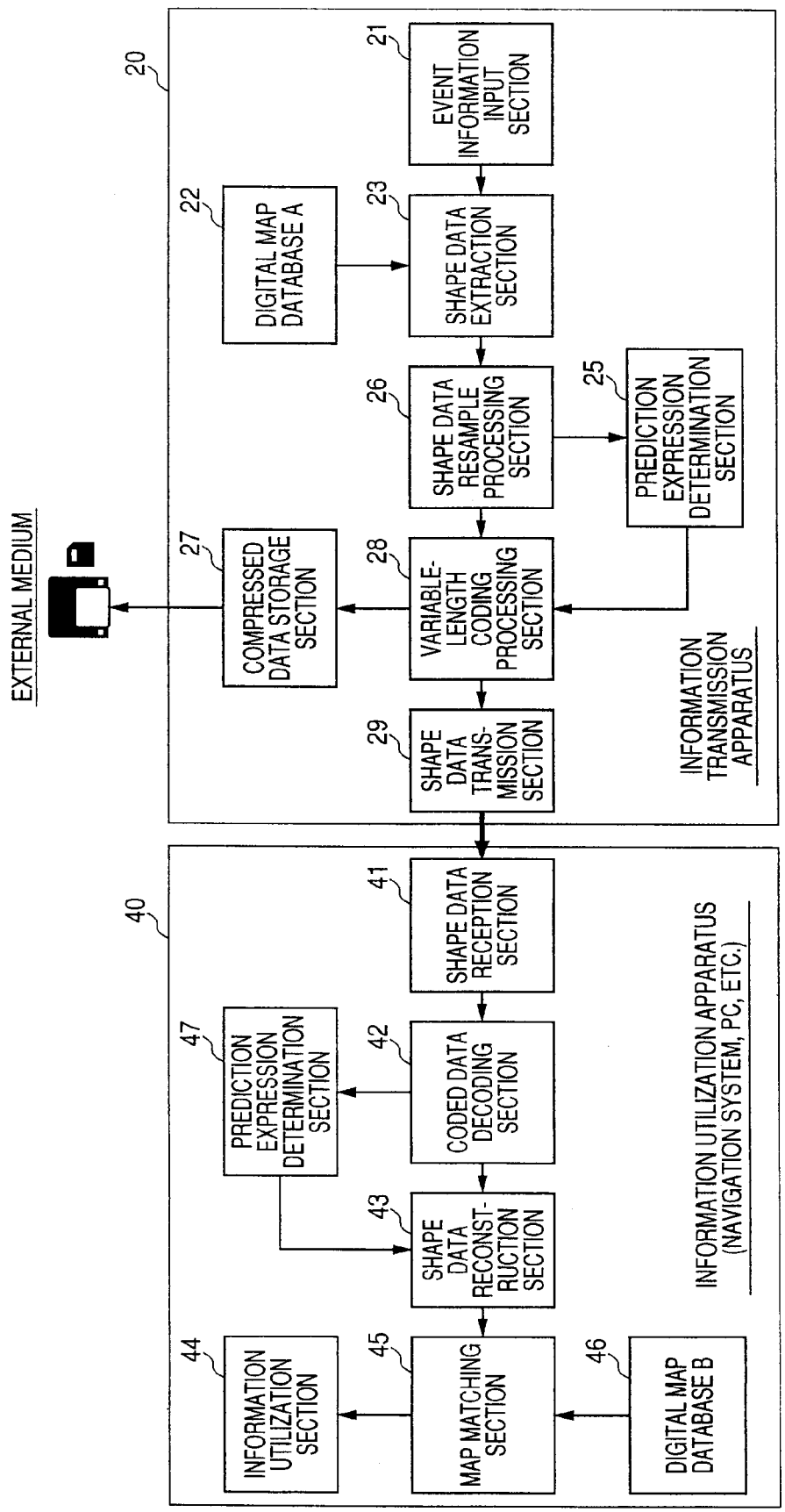
FIG. 24 is a block diagram to show the configurations of an information transmission apparatus and an information utilization apparatus in the embodiment of the invention.

FIG. 24 shows the configurations of an information transmission apparatus (coded data generation apparatus) 20 for executing the coded data generation method to report the vehicle information object road and an information utilization apparatus (coded data reconstruction apparatus) 40 such as a vehicle-installed navigation system or a personal computer to make the most of the provided vehicle information. The information transmission apparatus 20 includes an event information input section 21 to which congestion information and traffic accident information are input, a shape data extraction section 23 for extracting the road shape data in the object road zone of vehicle information from a digital map database A 22, a shape data resample processing section 26 for resampling the road shape data extracted in the shape data extraction section 23 and generating a deflection angle string of node position data, a prediction expression determination section 25 for determining a prediction expression to convert the deflection angle string into a predicted difference value string, a variable-length coding processing section 28 for converting the deflection angle of the shape data into a predicted difference value using the prediction expression determined by the prediction expression determination section 25 and performing compression and coding, a compressed data storage section 27 for storing the compressed and coded road shape data and providing the stored data for an external medium, and a shape data transmission section 29 for transmitting the compressed and coded road shape data.

On the other hand, the information utilization apparatus 40 includes a shape data reception section 41 for receiving the provided road shape data, a coded data decoding section 42 for decoding the compressed and coded data, a prediction expression determination section 47 for identifying the prediction expression used at the conversion time to the predicted difference value, a shape data reconstruction section 43 for reconstructing the shape data using the prediction expression identified by the prediction expression determination section 47, a map matching section 45 for performing map matching using data in a digital map database B 46 and determining a road zone represented by node points on a digital map, and an information utilization section 44 for making the most of the provided information.

In the information transmission apparatus 20, the shape data extraction section 23 extracts the road shape data of the object road, and the shape data resample processing section 26 resamples the road shape data and generates a deflection angle string of the road shape data. The prediction expression determination section 25 determines the prediction expression to convert the deflection angle string into a predicted difference value string according to the "object road unit selection mode," the "pattern unit selection mode," the "block unit selection mode," the "resample length linkage mode," or the "sequential selection mode" described above. The variable-length coding processing section 28 calculates a predicted value according to the prediction expression determined by the prediction expression determination section 25, subtracts the predicted value from each deflection angle in the deflection angle string to generate a predicted difference value string, and variable-length codes the predicted difference value string.

The road shape data compressed by variable-length coding is recorded on an external medium and is provided, or is transmitted from the shape data transmission section 29.

In the information utilization apparatus 40 receiving the road shape data, the coded data decoding section 42 decodes the compressed and coded data. The prediction expression determination section 47 identifies the prediction expression to decode the deflection angle from the provided data, and the shape data reconstruction section 43 reproduces the deflection angle string using the prediction expression and converts each deflection angle into latitude and longitude data to reproduce the road shape data. The resample shape concatenating the nodes reproduced is superposed on the digital map for display on a screen of the information utilization apparatus 40.

To accurately determine the road zone, the map matching section 45 performs map matching between the position data of the node point reproduced and the map data in the digital map database B 46 and determines the object road on the digital map data. The information utilization apparatus 40 can also implement a car navigation receiver or a map display terminal.

Figure 25:
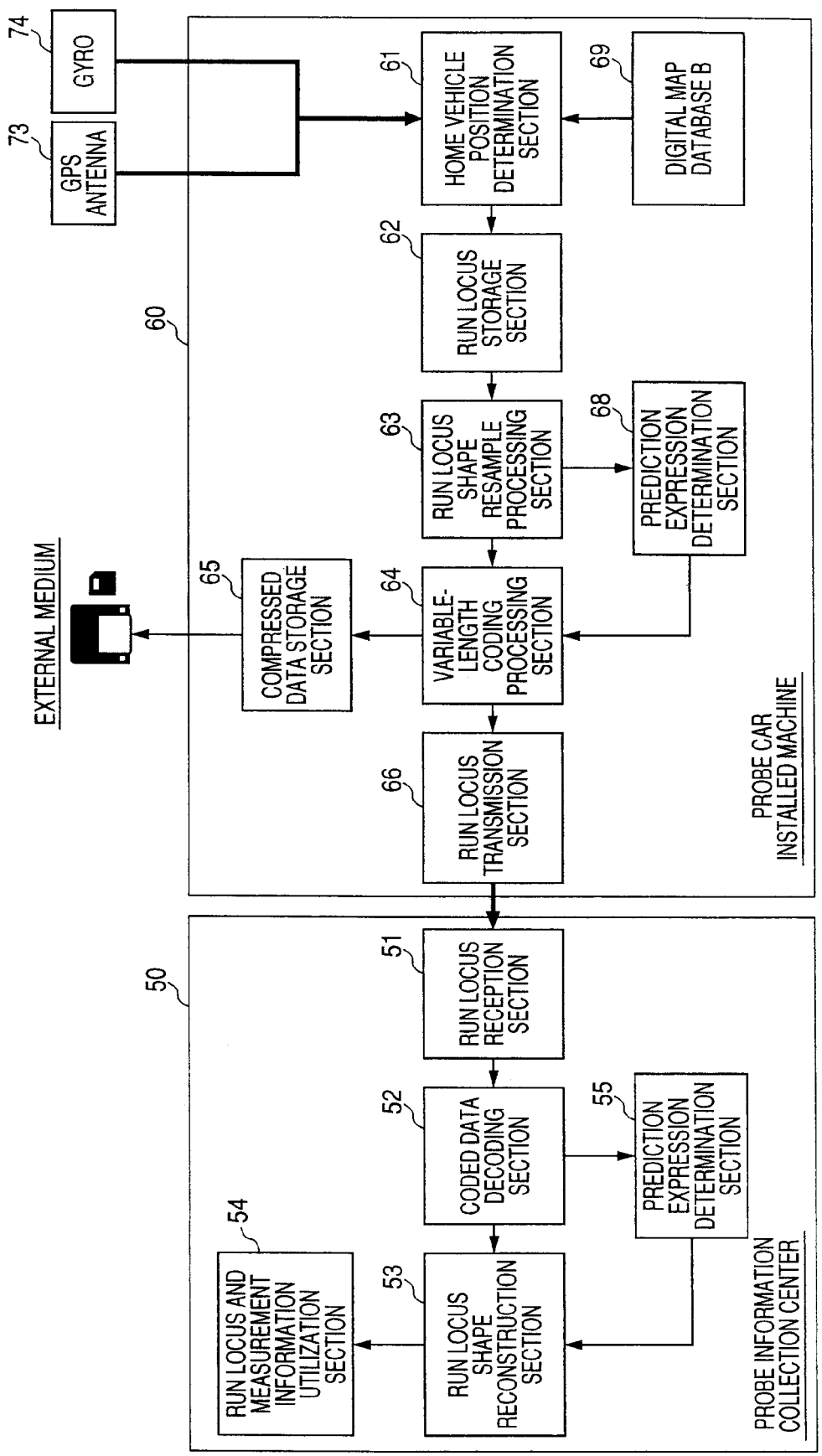
FIG. 25 is a block diagram to show the configurations of a probe car installed machine and a probe information collection center in the embodiment of the invention.
Figure 26A:
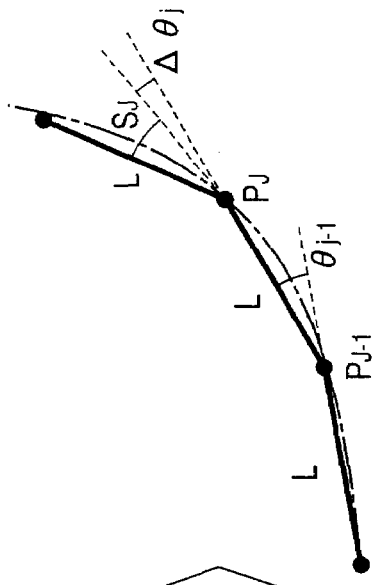
FIG. 26 is a drawing to describe a method of converting position data into data having a statistical bias.
Figure 26B:
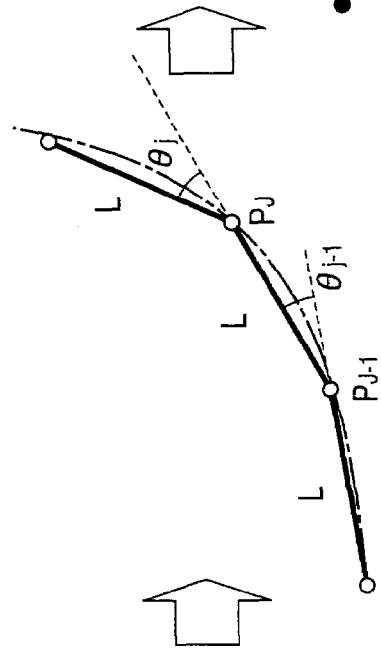
Figure 26C:
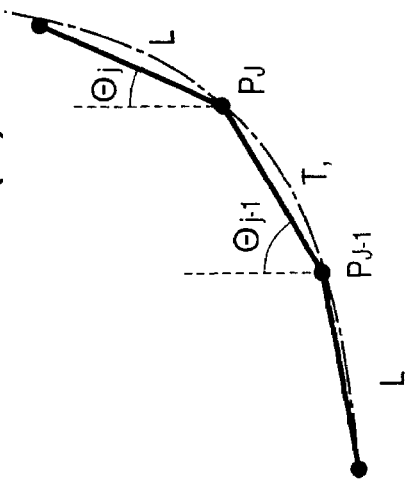
Figure 26D:
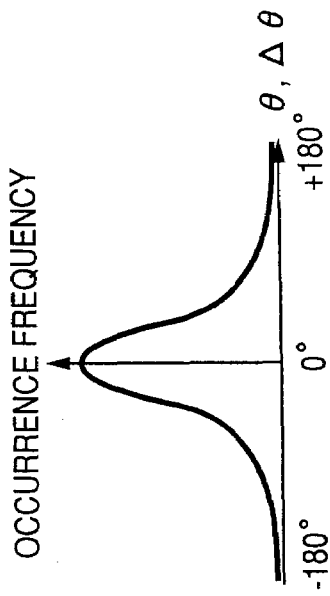
Figure 28:
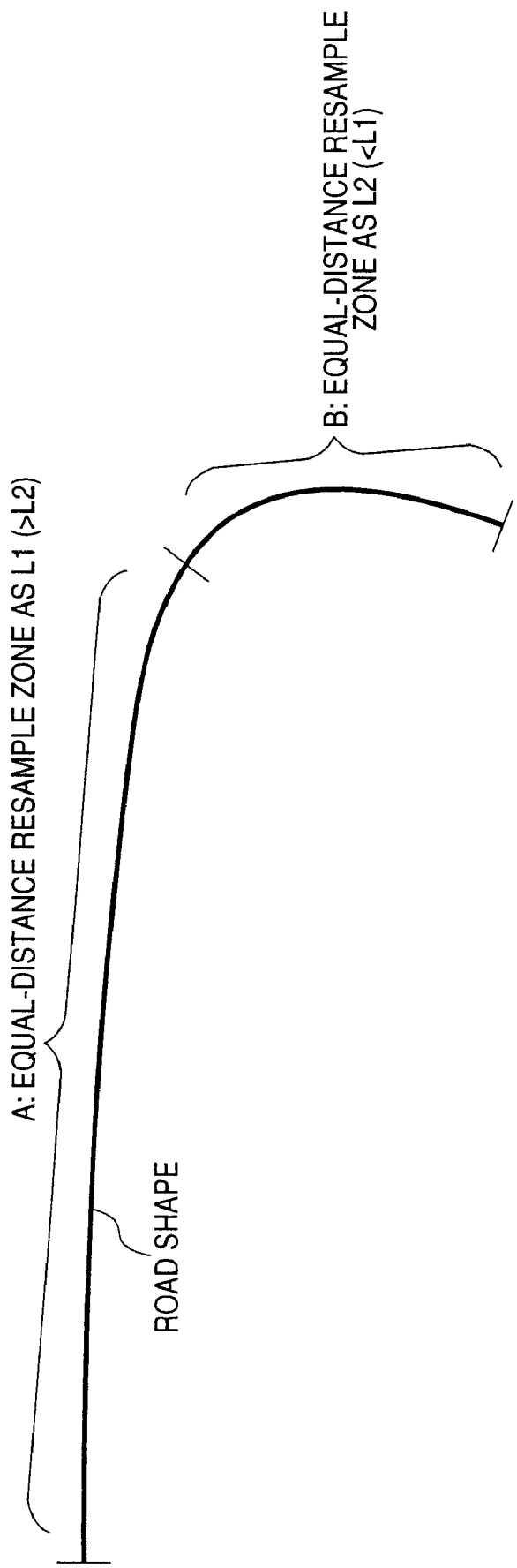
FIG. 28 is a drawing to describe sample length change depending on the curvature of a road shape.

FIG. 25 shows the configurations of a probe car installed machine (coded data generation apparatus) 60 for executing the coded data generation method to report the run locus and a probe information collection center (coded data reconstruction apparatus) 50 for collecting probe information. The probe car installed machine 60 includes a home vehicle position determination section 61 for determining the home vehicle position based on information received from a GPS antenna 73 and detection information of a gyro 74, a digital map database 69, a run locus storage section 62 for storing the run locus of the home vehicle, a run locus shape resample processing section 63 for resampling the run locus and generating a deflection angle string of node position data, a prediction expression determination section 68 for determining a prediction expression to convert the deflection angle string into a predicted difference value string, a variable-length coding processing section 64 for converting the deflection angle of the run locus shape data into a predicted difference value using the prediction expression determined by the prediction expression determination section 68 and performing compression and coding, a compressed data storage section 65 for storing the compressed and coded run locus shape data, and a run locus transmission section 66 for transmitting the compressed and coded run locus shape data.

On the other hand, the probe information collection center 50 includes a run locus reception section 51 for receiving the run locus shape data provided by the probe car installed machine 60, a coded data decoding section 52 for decoding the compressed and coded reception data, a prediction expression determination section 55 for identifying the prediction expression used at the conversion time to the predicted difference value, a run locus shape reconstruction section 53 for reconstructing the run locus shape using the prediction expression identified by the prediction expression determination section 55, and a run locus and measurement information utilization section 54 for making the most of the run locus and measurement information collected from the probe car installed machine 60 to generate vehicle information.

The home vehicle position detected in the home vehicle position determination section 61 is stored in the run locus storage section 62 of the probe car installed machine 60 in sequence as the run locus. The run locus shape resample processing section 63 reads the run locus data stored in the run locus storage section 62, resamples the run locus, and generates a deflection angle string of the run locus shape data. The prediction expression determination section 68 determines the prediction expression to convert the deflection angle string into a predicted difference value string according to the "object road unit selection mode," the "pattern unit selection mode," the "block unit selection mode," the "resample length linkage mode," or the "sequential selection mode" described above. The variable-length coding processing section 64 calculates a predicted value according to the prediction expression determined by the prediction expression determination section 68, subtracts the predicted value from each deflection angle in the deflection angle string to generate a predicted difference value string, and variable-length codes the predicted difference value string. The compressed and coded data is transmitted to the probe information collection center 50 at the probe information transmission timing. The data may be stored on an external medium so as to be provided for the probe information collection center 50.

In the probe information collection center 50, the coded data decoding section 52 decodes the data collected from the probe car installed machine 60. The prediction expression determination section 55 identifies the prediction expression to decode the deflection angle from the provided data, and the run locus shape reconstruction section 53 reproduces the deflection angle string using the prediction expression and converts each deflection angle into latitude and longitude data to reproduce the run locus data. The most of the run locus information is made to generate vehicle information together with the measurement information of the speed, etc., measured in the probe car installed machine 60.

Thus, the information transmission apparatus and the probe car installed machine can efficiently compress the data amount by generating the coded data of the object road and the run locus using the coded data generation method of the invention.

A probe car system is constructed using the probe car installed machine 60 and the probe information collection center 50 in combination, and an information transmission method in the probe car system is accomplished between them; this method is accomplished using the coded data generation method and the coded data decoding method of the invention in combination.

In the example described above, the coded data generation apparatus is the information transmission apparatus 20 or the probe car installed machine 60 of an information transmission center; it is an embodiment in the information transmission party and may be any if it is an apparatus or terminal that can transmit information. Further, the generated coded data can also be recorded on a medium so as to be provided for any other apparatus. The information utilization apparatus 40 and the probe information collection center 50 of coded data reconstruction apparatus are also examples and may be any apparatus if the apparatus can make the most of information, such as a person computer or a mobile terminal. Of course, similar advantages can also be provided in the information collection center or the apparatus in the center that can reconstruct the coded data. Further, similar advantages can also be provided by performing reconstruction processing using a medium, etc., recording the coded data, needless to say.

The invention also contains a program for causing a computer to execute generation of code data provided by coding a linear object. The program causes the computer to execute the steps of resampling a linear object for setting a plurality of nodes and arranging position data of each node represented by a deflection angle from the immediately preceding node to generate a data string of the deflection angles; when the data string of the deflection angles is converted into predicted difference values indicating the difference from a predicted value to predict the position data of each of the nodes, evaluating the data string of the predicted difference values; selecting a prediction expression to calculate the predicted value from among a plurality of prediction expressions based on the evaluation result; and converting each deflection angle contained in the data string of the deflection angles generated by a shape data resample processing section into a predicted difference value from the predicted value calculated using the determined prediction expression and variable-length coding a data string of the predicted difference values. Such a program is incorporated in the information transmission apparatus 20 and the probe car installed machine 60 in various formats. For example, the program can be recorded in predetermined memory in the information transmission apparatus 20, the probe car installed machine 60 or an external apparatus. The program may be recorded in an information record unit such as a hard disk and an information record medium such as a CD-ROM, a DVD-ROM, or a memory card. The program may be downloaded via a network.

Further, the invention also contains a program for causing a computer to decode code data representing a linear object. The program causes the computer to execute the steps of decoding variable-length coded data representing position information of a linear object and reproducing shape data containing a data string of difference values each indicating the difference between a deflection angle and a predicted value; determining the prediction expression used to calculate the predicted value from the provided shape data; and calculating a predicted value using the determined prediction expression and reproducing position information of nodes of the linear object from the provided data string of the predicted difference values.

Such a program is also incorporated in the information utilization apparatus 40 and the probe information collection center 50 in various formats. For example, the program can be recorded in predetermined memory in the information utilization apparatus 40, the probe information collection center 50 or an external apparatus. The program may be recorded in an information record unit such as a hard disk and an information record medium such as a CD-ROM, a DVD-ROM, or a memory card. The program may be downloaded via a network.

The information transmission apparatus 20 and the information utilization apparatus 40 of the invention or the probe car installed machine 60 and the probe information collection center 50 are used in combination to make up a map data distribution system.

The algorithm (program) complying with the coded data generation method of the invention can be recorded on a record medium recording the map data corresponding to various pieces of map information in the map data main body. Accordingly, it is made possible to compress and code the map data main body.

In the description of the embodiment, the linear object is the road shape for position reference by way of example. However, the linear object is not limited to the road shape. The "linear object" contains all elongated shapes including various forms of a line, a curve, etc., and can contain all geographic information that can be represented by linear shapes on a map. Further, it also contains all represented by linear shapes, not relating to a map, such as fingerprints.

While the invention has been described in detail with reference to the specific embodiment, it will be obvious to those skilled in the art that various changes and modifications can be made without departing from the spirit and the scope of the invention.

The present application is based on Japanese Patent Application (No. 2003-357730) filed on Oct. 17, 2003, which is incorporated herein by reference.

INDUSTRIAL APPLICABILITY

The coded data generation method of the invention can be used when coded data representing position information of road shapes, rivers, railways, administrative district boundaries, contour lines, etc., of a digital map is generated and is transmitted, stored, retained, etc. In addition to the digital map, the coded data generation method can also be applied when coded data representing linear objects of various patterns, fingerprints, etc., is generated and is transmitted, stored, retained, etc.

The invention claimed is:

1. A method of coding a linear object represented by a string of latitude and longitude coordinates, the method comprising:
 sampling the linear object at a constant length;
 representing the sampled linear object by two elements of the constant length and a data of angles, each angle being determined by a line from a first point to a downstream point;

converting the data string of the angles into a data string of deflection angles, each deflection angle showing a direction difference between a line from a second point to a downstream point and another line from an upstream point to the second point;

converting the data string of deflection angles into a data string of predicted difference values, each predicted difference value being provided by obtaining a difference between a predicted deflection angle on a third point predicted by a prediction formula using a deflection angle on an upstream point and the actual deflection angle of the third point; and variable-length coding the data string of the predicted difference values.

2. The method according to claim 1, wherein the linear object is a road shape.

3. A transmission apparatus for coding a linear object represented by a string of latitude and longitude coordinates, the transmission apparatus comprising:

a sampling unit for sampling the linear object at a constant length;

a representing unit for representing the sampled linear object by two elements of the constant length and a data string of angles, each angle being determined by a line from a first point to a downstream point;

a converting unit for converting the data string of the angles into a data string of deflection angles, each deflection angle showing a direction difference between a line from a second point to a downstream point and another line from an upstream point to the second point;

a converting unit for converting the data string of the deflection angle into a data string of predicted difference values, each predicted difference value being provided by obtaining a difference between a predicted deflection angle on a third point predicted by a prediction formula using a deflection angle on an upstream point and the actual deflection angle of the third point; and a coding unit for variable-length coding the data string of the predicted difference value.

4. The transmission apparatus according to claim 3, wherein the linear object is a road shape.

5. A method of decoding a coded data string of predicted difference value coded by a method according to claim 1, the method comprising:

variable-length decoding the data string of the predicted difference values;

converting the data string of the predicted difference values into a data string of deflection angles using the prediction formula used when converting the data string of the deflection angles into the data string of the predicted difference values; and reproducing a linear object based on the data string of the deflection angles.

6. The method according to claim 5, wherein the linear object is a road shape.

7. A receiving apparatus for decoding coded string of predicted difference values coded by a transmission apparatus according to claim 5, the receiving apparatus comprising:

a decoding unit for variable-length decoding the data string of the predicted difference values;

a converting unit for converting the data string of the predicted difference values into a data string of deflection angles using the prediction formula used in the transmission apparatus when converting the data string of the deflection angles into the data string of the predicted difference values; and a reproducing unit for reproducing a linear object based on the data string of the deflecting angles.

8. The receiving apparatus according to claim 1, wherein the linear object is a road shape.

9. The method according to claim 1, wherein the first, second and third points correspond to a same point.

10. The transmission apparatus according to claim 3, wherein the first, second and third points correspond to a same point.

* * * * *

UNITED STATES PATENT AND TRADEMARK OFFICE
CERTIFICATE OF CORRECTION

PATENT NO. : 7,528,746 B2
APPLICATION NO. : 11/835066
DATED : May 5, 2009
INVENTOR(S) : Shinya Adachi It is certified that error appears in the above-identified patent and that said Letters Patent is hereby corrected as shown below:

In Column 1, line 46, after JP-A-2003-23357, please insert --discloses--.

In Column 2, line 1, please delete "(1) Conversion of Position Data to a Single Variable" and insert therefor --(1) Conversion of position data to a single variable--.

In Column 2, line 24, please delete "(2) Conversion of a Single Variable Value to a Value Having a Statistical Bias" and insert therefor --(2) Conversion of a single variable value to a value to having statistical bias--.

In Column 3, line 65, please delete "(3) Variable-Length Coding" and insert therefor --(3) Variable-length coding--.

In Column 11, line 5, please delete "0 $\varphi=2$;" and insert therefor --0. . $\varphi=2$;--.

In Column 11, line 10, please delete "$\{\theta j - (\theta j-1 + \theta j-2)/2\}$ $\varphi=4$;" and insert therefor --$\{\theta j - (\theta j-1 + \theta j-2)/2\}$.. $\varphi=4$;--.

In Column 12, line 22, please delete "(1) Object Road Unit Selection Mode" and insert therefor --(1) Object road unit selection mode--.

In Column 12, line 56, please delete "$(=A\theta j = \theta j-Sj)$" and insert therefor --$(=\Delta\theta j = \theta j-Sj)$--.

In Column 13, line 57, please delete "(2) Pattern Unit Selection Mode" and insert therefor --(2) Pattern unit selection mode--.

In Column 14, line 62, please delete "(3) Block Unit Selection Mode" and insert therefor --(3) Block unit selection mode--.

In Column 15, line 44, please delete "(4) Resample Length Linkage Mode" and insert therefor --(4) Resample length linkage mode--.

CERTIFICATE OF CORRECTION (continued)
U.S. Pat. No. 7,528,746 B2

In Column 16, line 25, please delete "(5) Sequential Selection Mode" and insert therefor --(5) Sequential selection mode--.

Signed and Sealed this

Sixteenth Day of March, 2010

David J. Kappos
*Director of the United States Patent and Trademark Office*